United States Patent
Huang et al.

(10) Patent No.: US 11,748,650 B2
(45) Date of Patent: *Sep. 5, 2023

(54) METHODS AND SYSTEMS OF FULLY-RANDOMIZED BENCHMARKING FOR QUANTUM CIRCUITS

(71) Applicant: Alibaba Singapore Holding Private Limited, Singapore (SG)

(72) Inventors: Jiachen Huang, San Mateo, CA (US); Jianxin Chen, Kirkland, WA (US)

(73) Assignee: Alibaba Singapore Holding Private Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,744

(22) Filed: Apr. 26, 2022

(65) Prior Publication Data

US 2022/0309373 A1 Sep. 29, 2022

Related U.S. Application Data

(63) Continuation of application No. 17/208,278, filed on Mar. 22, 2021, now Pat. No. 11,348,027.

(51) Int. Cl.
*G06N 10/00* (2022.01)
*H03K 19/195* (2006.01)

(52) U.S. Cl.
CPC .......... *G06N 10/00* (2019.01); *H03K 19/195* (2013.01)

(58) Field of Classification Search
None
See application file for complete search history.

(56) References Cited

U.S. PATENT DOCUMENTS 11,087,233 B2 * 8/2021 Martinis ............... G06F 15/80
2021/0049492 A1 * 2/2021 Kim ..................... G06N 10/00
(Continued)

OTHER PUBLICATIONS

PCT International Search Report and Written Opinion dated Jul. 12, 2022, issued in corresponding International Application No. PCT/SG2022/050124 (12 pgs.).

(Continued)

*Primary Examiner* — Jany Richardson
(74) *Attorney, Agent, or Firm* — Finnegan, Henderson, Farabow, Garrett & Dunner, LLP

(57) ABSTRACT

Methods, apparatuses, and systems include: based on a parameter of a quantum gate, generating representations of $m_1$ random unitary quantum gates; determining a representation of a first quantum-gate sequence equivalent to an identity operator; determining a representation of a second quantum-gate sequence equivalent to the identity operator; sending, to a quantum computing device, hardware instructions corresponding to the representation of the first quantum-gate sequence the second quantum-gate sequence; receiving a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and determining a fidelity value of the quantum gate based on a first probability and a second probability.

20 Claims, 6 Drawing Sheets

(56) References Cited

U.S. PATENT DOCUMENTS

2021/0357796 A1* 11/2021 Maslov ............... H03K 19/195
2021/0365824 A1* 11/2021 Maslov ................ G06N 10/20
2022/0027774 A1* 1/2022 Jin ....................... G06N 10/40

OTHER PUBLICATIONS

Helsen et al., "A general framework for randomized benchmarking," arxiv.org, Cornell University Library, 60 pages (2020).
Nakata et al., "Quantum circuits for exact unitary t-designs and applications to higher-order randomized benchmarking," PRX Quantum, vol. 2, No. 3, 32 pages (2021).

* cited by examiner

200

300

US 11,748,650 B2

METHODS AND SYSTEMS OF FULLY-RANDOMIZED BENCHMARKING FOR QUANTUM CIRCUITS

CROSS-REFERENCE TO RELATED PATENT APPLICATIONS

This disclosure is a continuation of U.S. patent application Ser. No. 17/208,278 filed Mar. 22, 2021, the contents of which are incorporated herein by reference in its entirety.

TECHNICAL FIELD

The present disclosure generally relates to quantum computing, and more particularly, to methods, systems and non-transitory computer readable media of fully-randomized benchmarking for quantum circuits.

BACKGROUND

Quantum computers offer the ability to perform certain tasks impracticable for classical computers. These tasks would bring enormous advances to numerous engineering disciplines and enable valuable goals such as the discovery of new materials, the synthesis of better pharmaceuticals, and the creation of more energy dense batteries. The performance of the quantum computers can be evaluated based on various indicators, the process of which can be referred to as "benchmarking." However, existing benchmarking techniques for quantum computers have limitations and cannot be universally applied to arbitrary quantum circuits.

SUMMARY OF THE DISCLOSURE

The present disclosure methods, systems and non-transitory computer readable media for benchmarking quantum circuits. In one example embodiment, a non-transitory computer-readable medium is provided, which stores a set of instructions that is executable by at least one processor of an apparatus to cause the apparatus to perform a method. The method includes: based on a parameter of a quantum gate, generating representations of $m_1$ random unitary quantum gates, $m_1$ being an integer; determining a representation of a first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator; determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator; sending, to a quantum computing device, hardware instructions corresponding to the representation of the first quantum-gate sequence and hardware instructions corresponding to the representation of the second quantum-gate sequence; receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and determining a fidelity value of the quantum gate based on a first probability that a quantum state of the qubit is unchanged over the first number of measurements of the qubit and a second probability that the quantum state of the qubit is unchanged over the second number of measurements of the qubit.

In another aspect, an apparatus for video processing is provided. The apparatus includes a memory configured to store a set of instructions and one or more processors communicatively coupled to the memory and configured to execute the set of instructions to cause the apparatus to perform: based on a parameter of a quantum gate, generating representations of $m_1$ random unitary quantum gates, $m_1$ being an integer; determining a representation of a first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator; determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator; sending, to a quantum computing device, hardware instructions corresponding to the representation of the first quantum-gate sequence and hardware instructions corresponding to the representation of the second quantum-gate sequence; receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and determining a fidelity value of the quantum gate based on a first probability that a quantum state of the qubit is unchanged over the first number of measurements of the qubit and a second probability that the quantum state of the qubit is unchanged over the second number of measurements of the qubit.

In another example embodiment, a method is provided. The method includes: based on a parameter of a quantum gate, generating representations of $m_1$ random unitary quantum gates, $m_1$ being an integer; determining a representation of a first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator; determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator; sending, to a quantum computing device, hardware instructions corresponding to the representation of the first quantum-gate sequence and hardware instructions corresponding to the representation of the second quantum-gate sequence; receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and determining a fidelity value of the quantum gate based on a first probability that a quantum state of the qubit is unchanged over the first number of measurements of the qubit and a second probability that the quantum state of the qubit is unchanged over the second number of measurements of the qubit.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Figure 1:
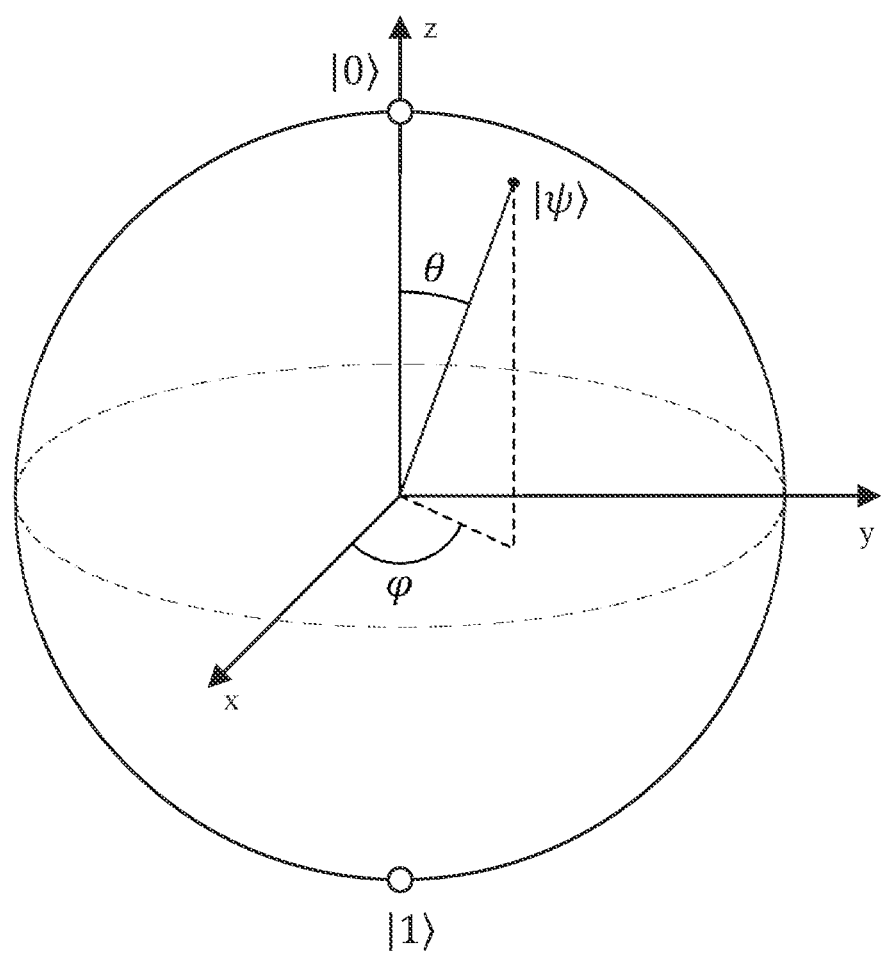
FIG. 1 is a diagram illustrating a qubit represented in a Bloch sphere, consistent with some embodiments of this disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

A "computer," as used herein, refers to a machine capable of executing instructions, calculations, computations, or algorithms for performing a series of ordered procedures or operations purporting to solve a task. Computers are ubiquitous in modern-day society, including direct involvement (e.g., smartphones and laptops) and indirect involvement (e.g., microcontrollers in cars or control systems in water purification plants). A computer must be implemented on some type of hardware (e.g., physical configuration of matter) subject to various limitations imposed by physics, which creates an upper bound on the computer's performance characteristics (e.g., amount of memory available or the number of operations-per-second allowed). Also, to solve a task, the computer must be provided with a set of instructions which, when followed, can cause the computer to accomplish the task.

A quantum computer, as used herein, refers to a computer that can perform quantum computations. Quantum computation in this disclosure refers to computation that uses quantum phenomena (e.g., superposition or entanglement) of hardware of the quantum computer. In contrast, a classical computer in this disclosure refers to a computer that cannot perform quantum computations, such as an electronic computer. Quantum computers can offer the ability to perform certain tasks deemed to be intractable to be solved by classical computers, and provide unique advantages. For example, a quantum computer can be used to simulate dynamics of molecules (that are governed by quantum physics in nature), factorize integers (that underlies many cryptography theories), search unstructured data, optimize quantum annealing and adiabatic processes, accelerate machine learning algorithms, or perform many computational tasks that are deemed intractable for classical computers. Such technological advantages can benefit many industries and research, such as creation of new materials, synthesis of new pharmaceuticals, or development of energy-dense batteries.

A classical computer operates in digital logic. Digital logic, as used herein, refers to a logic system that operates on units of information (referred to as "bits"). A bit can have one of two values as the smallest unit of information, usually denoted by "0" and "1." The digital logic can use digital logic gates to create, remove, or modify bits. Digital logic gates can be constructed using transistors, in which bits can be represented as voltage levels of wires connecting the transistors. A digital logic gate can take one or more bits as input and give one or more bits as output. For example, a logic AND gate can take two bits as input and gives one bit as output. The output of the AND gate can be "1" if the values of both inputs are "1," and can be "0" if otherwise. By connecting inputs and outputs of various digital logic gates together in specific ways, a classical computer can implement arbitrarily complex algorithms to accomplish various computational tasks.

On a surface level, quantum computers operate in a similar way to classical computers. A quantum computer operates in quantum logic. Quantum logic, as used herein, refers to a system of logic that operates on units of information referred to as "quantum bits" or simply "qubits." A qubit is the smallest unit of information in quantum computers, and can have any linear combination of two values, usually denoted $|0\rangle$ and $|1\rangle$. The value of the qubit can be denoted $|\psi\rangle$. Different from a digital bit that can have a value of either "0" or "1," $|\psi\rangle$ can have a value of $\alpha|0\rangle + \beta|1\rangle$ where $\alpha$ and $\beta$ are complex numbers (referred to as "amplitudes") not limited by any constraint except $|\alpha|^2 + |\beta|^2 = 1$. Qubits can be constructed in various forms and can be represented as quantum states of components of the quantum computer. For example, a qubit can be physically implemented using photons (e.g., in lasers) with their polarizations as the quantum states, electrons or ions (e.g., trapped in an electromagnetic field) with their spins as the quantum states, Josephson junctions (e.g., in a superconducting quantum system) with their charges, current fluxes, or phases as the quantum states, quantum dots (e.g., in semiconductor structures) with their dot spin as the quantum states, topological quantum systems, or any other system that can provide two or more quantum states. The quantum logic can use quantum logic gates (or simply "quantum gates") to create, remove, or modify qubits.

Mathematically, a quantum gate is a propagator acting on a quantum state. Physically, a quantum gate can be implemented as a hardware device capable of generating laser pulses, electromagnetic waves (e.g., microwave pulses), electromagnetic fields, or any means for changing, maintaining, or controlling the quantum states of the qubits. A quantum gate can take one or more qubits as input and give one or more qubits as output, and thus can be represented as a matrix. Unlike classical logic gates (e.g., the AND gate), a quantum gate has a characteristic that its input can be determined based on its output and information of the transformation it applies, which is referred to as "reversible." Such a reversible characteristic necessitates that the number of outputs of a quantum gate equals to or exceeds the number of its inputs, and ensures that the input to a known quantum gate can always be constructed given its output.

The advantages of the quantum computers stems from their ability to lower the computational complexity for some tasks deemed to be intractable (e.g., mathematically possible, but physically unrealizable) for classical computers. Generally, a computational task can be conceptualized as determining a specific property of an instance of some mathematical objects (e.g., a graph, a number, or a string) representing the computational task, and the instance of the mathematical objects can be typically conceptualized as a sequence of bits (e.g., 1's and 0's). In general, larger instances requires more time or space to solve. The time or space required to solve the computational task depends on the size of the instance, which is usually taken to be the size of the input of the instance in bits. For example, the input to the instance can have a length of n. In such a context, the computational complexity of the computational task can be defined as the resources required by the best algorithm to determine the specific property of the instance of the mathematical objects.

Typically, such computational complexity varies as a function of n. For example, an algorithm can take $5n^3+12n^2+2n+\log n+113$ number of steps for an input of size n. Generally, however, only the asymptotic complexity of an algorithm is evaluated, using the big O notation. The big O notation focuses on the growth rate of the computational complexity as n tends towards infinity, under which only the fastest growing factor of n are considered. For example, in big O notation, the number of steps (i.e., $5n^3+12n^2+2n+\log n+113$) used by the algorithm described above is $O(n^3)$. An algorithm is generally deemed to be practical if its asymptotic complexity is $O(n^k)$ (k being a finite number) and is generally deemed to be impractical if its asymptotic complexity is $O(k^n)$ (e.g., having more than polynomial growth). A computational task that has its best possible algorithm with an asymptotic complexity of $O(k^n)$ or higher is deemed to be intractable.

For different classical computers, the computational complexities for solving the same computational task only differ by a constant coefficient. By contrast, by taking advantage of certain aspects of quantum mechanics, a quantum computer can solve certain computational tasks in a polynomial number of steps that classical computers can only solve in an exponential number of steps. For those computational tasks, the computational complexity of the quantum computer can be polynomial with respect to the size of its input, while the computational complexity of a classical computer can be exponential.

Such features of the quantum computers stem from that qubits can be in a superposition of quantum states, which can represent infinite number of values. For example, a qubit $|\psi\rangle$ can be in a superposition of quantum states $|0\rangle$ and $|1\rangle$, represented as $\alpha|0\rangle+\beta|1\rangle$ where $\alpha$ and $\beta$ are arbitrary complex numbers and $|\alpha|^2+|\beta|^2=1$, and such that the value of $|\psi\rangle$ are not bound to either "0" or "1" as a digital bit is. Moreover, a group of qubits can expand the dimensions of the values that can be represented by the qubits. For example, a two-state qubit system can include a first qubit $|\psi_1\rangle=\alpha|0\rangle+\beta|1\rangle$ and a second qubit $|\psi_2\rangle=\gamma|0\rangle+\delta|1\rangle$. Qubits in such a two-state qubit system can represent combinations of two quantum states (e.g., $|0\rangle$ and $|1\rangle$). When the first and second qubits are entangled, they can form a four-state qubit system, where a qubit $|\varphi\rangle$ in such a four-state qubit system can be represented as $|\varphi\rangle=\alpha\gamma|00\rangle+\alpha\delta|01\rangle+\beta\gamma|10\rangle+\beta\delta|11\rangle$ (with $|\alpha\gamma|^2+|\alpha\delta|^2+|\beta\gamma|^2+|\beta\delta|^2=1$). Qubits in such a four-state qubit system can represent combinations of four quantum states (e.g., $|00\rangle$, $|01\rangle$, $|10\rangle$, and $|11\rangle$, referred to as "product states"). In general, a system of n entangled two-state qubits (e.g., having binary basis such as $|0\rangle$ and $|1\rangle$) can represent $2^n$ quantum states, which can be represented as a qubit $$x_1|\underbrace{00\ldots00}_{n}\rangle + x_2|\underbrace{00\ldots01}_{n}\rangle + \ldots + x_{n-1}|\underbrace{11\ldots00}_{n}\rangle + x_n|\underbrace{11\ldots11}_{n}\rangle (\text{with } |x_1|^2+|x_2|^2+\ldots+|x_n|^2=1).$$

Information can be coded and stored in the amplitudes (e.g., $x_1, x_2, \ldots, x_n$). By operating qubits with quantum gates, quantum computers can simultaneously operate on any number of amplitudes, which imbues a great speed advantage for certain computational tasks over classical computers (that can only simultaneously operate on finite number of values).

One way of visualizing a value of a qubit is to present the qubit as a point on a surface of a Bloch sphere. By way of example, FIG. 1 is a diagram illustrating a qubit represented in a Bloch sphere 100, consistent with some embodiments of this disclosure. Bloch sphere 100 can be conceptualized as existing in a three-dimensional (3D) space with coordinate axes x, y, and z, respectively. It takes two values (e.g., latitude and longitude, or angles $\varphi$ and $\theta$ in FIG. 1) to represent a point on the surface of Bloch sphere 100. In FIG. 1, the positive and negative poles of the z-axis correspond to $|0\rangle$ and $|1\rangle$, respectively. For a qubit $|\psi\rangle=\alpha|0\rangle+\beta|1\rangle$, because $\alpha$ and $\beta$ are complex numbers constrained by $|\alpha|^2+|\beta|^2=1$, $|\psi\rangle$ can be represented as a complex number $\alpha+bi$. The values of a and b can be mapped to azimuthal and equatorial angles $\varphi$ and $\theta$ in Bloch sphere 100, which in turn can be represented as a point on the surface of Block sphere 100 in FIG. 1.

Typically, quantum algorithms can be expressed in terms of their underlying quantum circuits. A quantum circuit includes one or more quantum gates. Because a quantum gate can transform a qubit in an infinite number of ways (e.g., by changing the values of $\alpha$ and $\beta$ in a qubit $\alpha|0\rangle+\beta|1\rangle$), there are infinite types of quantum gates. For example, there are infinite quantum gates for performing unitary transformations on qubits because there are an infinite number of ways to perform the unitary transformations. One type of quantum gates, known as "Pauli operators" or "Pauli gates," can be used to perform unitary transformations on qubits. There are four Pauli operators, referred to as I, X, Y, and Z, respectively, where I is the identity operator, and X, Y, and Z represent 180° rotations around the x-axis, y-axis, and z-axis in 3D space, respectively. For example, in system of two-state qubits, the Pauli gates can be represented as matrices $$I = \begin{pmatrix} 1 & 0 \\ 0 & 1 \end{pmatrix}, X = \begin{pmatrix} 0 & 1 \\ 1 & 0 \end{pmatrix}, Y = \begin{pmatrix} 0 & -i \\ i & 0 \end{pmatrix}, \text{ and } Z = \begin{pmatrix} 1 & 0 \\ 0 & -1 \end{pmatrix}.$$

The set of Pauli operators on n qubits can be defined as $\mathcal{P}_n = \{\sigma_1 \otimes \ldots \otimes \sigma_n | \sigma_i \in \{I, X, Y, Z\}\}$ and $|\mathcal{P}_n| = 4^n$, where subscripts indicate the qubits on which an operator acts. For a set of n qubits, there are $4^n$ Pauli matrices, each for a possible tensor product (in the form $\{\sigma_1 \otimes \ldots \otimes \sigma_n\}$) of $\sigma_i \in [I, X, Y, Z]$. For example, in a three-qubit system including three qubits $|\psi_1\rangle$, $|\psi_2\rangle$ and $|\psi_3\rangle$, a Pauli X gate acting on $|\psi_1\rangle$ and a Pauli Z gate acting on $|\psi_2\rangle$ can be represented as $X_1 Z_2 = X_1 Z_2 I_3 = X_1 \times Z_2 \times I_3 = (X \otimes I \otimes I) \times (I \otimes Z \otimes I) \times (I \otimes I \otimes I) = X \otimes Z \otimes I$.

The Pauli gates can be understood as rotations around the three principal axes of the Bloch sphere. By way of example, with reference to FIG. 1, the Pauli X gate, Pauli Y gate, and Pauli Z gate can be understood as causing the point representing $|\psi\rangle$ to rotate by 180° around the x-axis, y-axis, and z-axis in Bloch sphere 100, respectively.

Some quantum gates can be used to implement other quantum gates. In some cases, such quantum gates can form a group, in which quantum gates in the group can be used to implement any other quantum gate within the group to an arbitrary degree of precision (if a sufficient number of quantum gates are provided). One example of such sets of quantum gates is a Clifford group that includes a set of Pauli gates. A quantum gate in a Clifford group can be referred to as a "Clifford gate." When a Pauli gate in a Clifford group is multiplied on the left (referred to as "left multiplied") by a Clifford gate and multiplied on the right (referred to as "right multiplied") by a Hermitian adjoint of the Clifford gate, the resultant quantum gate is still a Pauli gate that is still in the Clifford group. A Clifford group operating on n qubits (represented as $\mathcal{C}_n$) includes Clifford gates $\{U \in U(2^n) | \forall \sigma \in \pm P_n \backslash \{I^{\otimes n}\} \Rightarrow U\sigma U^\dagger \in \pm P_n \backslash \{I^{\otimes n}\}\}$.

In some embodiments, a Clifford group (e.g., $\mathcal{C}_1$) operating on one qubit can be generated using a combination of Hadamard gates $$H = \frac{1}{\sqrt{2}} \begin{pmatrix} 1 & 1 \\ 1 & -1 \end{pmatrix}$$

and phase gates $$S = \begin{pmatrix} 1 & 0 \\ 0 & i \end{pmatrix}.$$

In some embodiments, a Clifford group (e.g., $\mathcal{C}_2$) operating on two or more qubits can be generated by a combination of the Hadmard gates, the phase gates, and controlled not ("CNOT") gates $$CNOT = \begin{pmatrix} 1 & 0 & 0 & 0 \\ 0 & 1 & 0 & 0 \\ 0 & 0 & 0 & 1 \\ 0 & 0 & 1 & 0 \end{pmatrix}.$$

For example, the Clifford group generated by the combination of the Hadmard gates, the phase gates, and the CNOT gates can form a unitary 2-design. To implement a general-purpose quantum computer, Clifford gates can be used together with T gates (also referred to as "π/4 gates")

$$T = \begin{pmatrix} 1 & 0 \\ 0 & e^{i\pi/4} \end{pmatrix}.$$

For example, a T gate can be generated as a π/4 phase rotation around a single-qubit Pauli Z gate:

$$T = |0\rangle\langle 0| + e^{i\pi/4}|1\rangle\langle 1| = \frac{1 + e^{i\pi/4}}{2}I + \frac{1 - e^{i\pi/4}}{2}Z.$$

A quantum circuit including Hadamard gates, phase gates, CNOT gates and T gates (e.g., for any quantum gate U in the quantum circuit, $U \in \{H, S, CNOT, T\}$) can be used to implement a general-purpose quantum computer. Such a circuit can be referred to as a "Clifford+T circuit."

One challenge to the quantum computers is that it is difficult to create and maintain qubits in an operatable state (e.g., entangled with other qubits). The precision of a quantum circuit depends on the precision of the qubits and the SPAM errors of the quantum circuit. However, qubits are essentially analog devices and are highly susceptible to noise, from either the surrounding environments or the operation of the quantum gates. Once the qubits become decoherent due to the disturbance of the noise, the calculation of the qubits is lost and cannot be restored. Existing quantum computing systems can only prepare and entangle a limited number of qubits, and perform a limited number of operations on these qubits before the entanglement is disrupted by noise.

Due to the susceptible nature of the qubits, total fidelity of quantum gates is an important performance indicator for quantum circuits. Total fidelity or total infidelity of a quantum gate, as used herein, refers to a ratio of correct or incorrect results over a total number of results of the quantum gate, respectively. The total infidelity of quantum gates can have two contributing sources: the decoherence of qubits caused by application of quantum gates and the operation (e.g., preparation, calibration, or measurement) of quantum gates (referred to as "state preparation and measurement errors" or "SPAM errors"). For example, the decoherence of qubits can be an unexpected and undesired result of applying a quantum gate onto the qubit, while the SPAM errors can contribute to the total infidelity without causing the decoherence of qubits. Although these two contributing sources can have overlapping causes, the development of quantum computers focus more on the contribution from the decoherence of qubits because it reflects the performance of the hardware of a quantum circuit.

Benchmarking, as used herein, refers to procedures or processes of evaluating the fidelity of a quantum computing system that includes one or more quantum gates. Based on the benchmark results, quantum error correction can be applied to the quantum computing system for increasing its fidelity. For example, for a quantum circuit built based on superconducting qubits (e.g., transmon qubits that use Josephson junctions), the quantum characteristic of the quantum circuit is from the characteristic of Cooper pairs of electrons (e.g., bound electron pairs in a superconducting metal). Cooper pairs are bosons that conform to Bose- Einstein distribution for their quantum states to present a macroscopic electrical property. On a macroscale, a quantum state of a superconducting qubit device can be represented by electrical properties (e.g., charge, phase, or current flux) of the superconducting qubit device, and can be modified or controlled by electromagnetic signals (e.g., microwave pulses generated by an oscillator circuit) applied to the superconducting qubit device. The electromagnetic signals with a specific frequency can cause the superconducting qubit to jump between different energy levels (e.g., between a ground state and an excited state). By tuning the electromagnetic signals (e.g., changing its frequency, amplitude, or waveform) and parameters of the superconducting qubit (e.g., capacitance of the transmon qubit), the quantum error correction can be performed for the quantum circuit.

One way of checking fidelity of a quantum circuit is to apply a unitary operation on a qubit that is implemented on a hardware component of the quantum circuit and measure the qubit after applying the unitary operation to determine whether the qubit is still in the same quantum state. If the quantum state of the qubit changes, it indicates that an infidelity error has occurred in the quantum circuit, either due to the decoherence of the qubit or due to the SPAM errors of a quantum gate that operates on the qubit. In some embodiments, the above-described unitary operation can be implemented by a Pauli gate or a Clifford gate because they are reversible. For example, a unitary gate can be implemented as a Pauli gate (e.g., X) and a Hermitian adjoint of the Pauli gate (e.g., $X^\dagger$) connected in series.

Existing benchmarking techniques for quantum circuits are either only applicable to a specific type of quantum gates or unable to identify infidelity contributed from qubit decoherence (e.g., not caused by SPAM errors). For example, a Clifford-group based randomized benchmarking technique can be used for benchmarking Clifford gates. The randomized benchmarking technique can randomly select m (m being an integer) Clifford gates $U_1, U_2, \ldots, U_m$ from a Clifford group, form a gate $U=U_1 \cdot U_2 \cdot \ldots \cdot U_m$ by concatenating the m Clifford gates in the uses the Clifford group, and form an inverse gate $U^\dagger=(U_1 \cdot U_2 \cdot \ldots \cdot U_m)^\dagger = U_m^\dagger \cdot \ldots \cdot U_2^\dagger \cdot U_1^\dagger$. For example, U and $U^\dagger$ can be constructed by building corresponding hardware of quantum circuits. Then, the gates U and $U^\dagger$ can be applied to one or more ground-state qubits (e.g., $|0\rangle$), after which a resulting qubit can be measured. For example, the application of U and $U^\dagger$ onto a ground-state qubit can be $U^\dagger \cdot U|0\rangle$. By repeating the random selection of the m Clifford gates, generation and application of the m unitary gates, and measurement of the resulting qubits, a fidelity of a quantum gate in the Clifford group can be determined. If such repetition is performed over many values of m, a relationship between the fidelity of the Clifford gate and the value of m can be determined (e.g., via fitting). For example, if such a relationship can be fitted to be an exponential decay, then the rate of decay can be used as a measure of the average fidelity of the quantum gates in the Clifford group. However, the Clifford-group based randomized benchmarking technique cannot be used for other types of quantum gates. In some cases, quantum gates implemented in a quantum circuit can include a non-Clifford quantum gate (e.g., implemented as a single physical device) that cannot be generated by combinations of Clifford gates. If the Clifford-group based randomized benchmarking technique is used in those cases, the compiling performance of the quantum circuit can suffer a lost.

As another example, a quantum process tomography (QPT) technique can be used for benchmarking non-Clifford quantum gates. For a specific quantum computing system, its qubits can form a Hilbert space. The QPT technique can prepare a set of input states spanning over the Hilbert space and apply a unitary gate onto each of the input states. Based on outputs of the unitary gate, the output density matrix corresponding to each input states can be reconstructed. Then, based on the input states and the output density matrix, a process matrix can be determined (e.g., via maximum likelihood estimation) that represents a mapping between the input states and the outputs. The difference between the process matrix and a matrix representing the unitary gate can be used to represent the fidelity of the non-Clifford quantum gates. However, the QPT technique cannot differentiate infidelity contributed by the decoherence of the qubit and infidelity contributed by the SPAM errors of the non-Clifford quantum gates.

In yet another example, a cross-entropy benchmarking (XEB) technique can be used for benchmarking Fermionic simulation ("fSim") quantum gates. The XEB technique can randomly generate a series of quantum gates that include fSim quantum gates and a certain type of quantum gates operating on a single qubit (referred to as "single-qubit gates"), and interleave the fSim quantum gates and the single-qubit gates by cycles. By comparison to simulations, the cross-entropy of the series of quantum gates can be calculated, based on which the fidelity can be determined. However, the XEB technique is only applicable to fSim-type quantum gates, and can only determine average fidelity for all of the fSim quantum gates in the generated series of quantum gates. That is, the XEB technique is unable to determine fidelity of a single fSim quantum gate.

This disclosure provides technical solutions for benchmarking quantum circuits using a technique referred to as "fully-randomized benchmarking." The fully-randomized benchmarking technique can be used to benchmark any type of quantum gates (e.g., including but not limited to Clifford gates) to identify the quantum gate infidelity contributed by qubit decoherence, separated from the contribution from the operation (e.g., preparation, calibration, or measurement) of the quantum gates. Based on the result of the fully-randomized benchmarking, the hardware corresponding to the quantum circuit can be corrected (e.g., by adjusting physical parameters) to achieve better performance. The provided methods, apparatuses, and systems are applicable to any type of quantum computing systems for benchmarking, and therefore enhance its universality and advantages in compiling.

Aspects of this disclosure can relate to fully-randomized benchmarking for quantum circuits, including systems, apparatuses, methods, and non-transitory computer-readable media. For ease of description, a method is described below, with the understanding that aspects to the method apply equally to systems, apparatuses, and non-transitory computer-readable media. For example, some aspects of such a method can be implemented by a system, an apparatus, or as program codes or computer instructions stored in a non-transitory computer-readable medium. In a broadest sense, the method is not limited to any particular physical or electronic instrumentalities, but rather can be accomplished using many different instrumentalities.

Consistent with some embodiments of this disclosure, a method for operating (e.g., benchmarking, controlling qubits for computation, controlling qubits for compiling, or any manipulation of qubits) a quantum circuit can include causing a computer (e.g., a classical computer) to generate representations (e.g., matrices or tensors) of $m_1$ ($m_1$ being an integer) random unitary quantum gates based on a parameter of a quantum gate. A unitary quantum gate can perform a unitary transformation on a qubit. The qubit can be physically implemented using photons (e.g., in lasers) with their polarizations as the quantum states, electrons or ions (e.g., trapped in an electromagnetic field) with their spins as the quantum states, Josephson junctions (e.g., in a superconducting quantum system) with their charges, current fluxes, or phases as the quantum states, quantum dots (e.g., in semiconductor structures) with their dot spin as the quantum states, topological quantum systems, or any other system that can provide two or more quantum states. A quantum gate can be implemented as a hardware device capable of generating laser pulses, electromagnetic waves (e.g., microwave pulses), electromagnetic fields, or any means for changing, maintaining, or controlling the quantum states of the qubits. In some embodiments, the qubit can be implemented as a superconducting qubit, and the quantum gate can be implemented as an electromagnetic signal (e.g., a microwave pulse signal generated by an external oscillator). In such cases, the parameter of the quantum gate can include at least one of a length, an amplitude, or a shape of the electromagnetic signal.

In some embodiments, to generate the representations of $m_1$ random unitary quantum gates, the method can include causing the computer to generate the representations of $m_1$ random unitary quantum gates in accordance with a Haar measure. A Haar measure in this disclosure refers to a uniform probability distribution over all quantum states or over all unitary operators. For example, the computer can randomly sample a unitary matrix from a group of unitary matrices conforming to the Haar measure for $m_1$ times to generate the $m_1$ random unitary quantum gates. In some embodiments, to generate the representations of $m_1$ random unitary quantum gates, the method can include causing the computer to generate the representations of $m_1$ random unitary quantum gates by pseudo-random sampling a space of unitary operators in accordance with a uniform probability distribution. It should be noted that, the generated $m_1$ random unitary quantum gates are not limited to Clifford gates or any other type of quantum gates.

Consistent with some embodiments of this disclosure, the method for operating a quantum circuit can also include causing the computer to determine a representation (e.g., a matrix or a tensor) of a first quantum-gate sequence by inserting the quantum gate between each neighboring unitary quantum gates of the $m_1$ random unitary quantum gates and appending (e.g., by concatenating to the end of) the quantum gate and a first recovery quantum gate to the $m_1$ random unitary quantum gates such that the first quantum-gate sequence is equivalent to an identity operator. A quantum-gate sequence in this disclosure refers to a set of quantum gates that are arranged in a sequential order. The first quantum-gate sequence includes $m_1$ random unitary quantum gates and $m_1$ inserted quantum gates that are arranged after each of the $m_1$ random unitary quantum gates to form an alternative or interleaving manner, in which the first quantum-gate sequence includes $2m_1+1$ quantum gates in total (including the appended first recovery quantum gate).

A recovery quantum gate corresponding to a quantum gate, as used herein, can perform transformations to a qubit to invert transformations performed by the quantum gate onto the qubit. The net effect of applying a quantum gate followed by its recovery quantum gate on a qubit is equivalent to applying an identify operator (e.g., an identity Pauli gate I) onto the qubit. Unlike classical logic gates, a quantum gate always has a recovery quantum gate due to its reversible characteristic. For example, if a quantum gate can modify a qubit from $0.6|0\rangle +0.8|1\rangle$ to $0.8|0\rangle +0.6|1\rangle$, then a recovery quantum gate of the quantum gate can modify the qubit from $0.8|0\rangle +0.6|1\rangle$ back to $0.6|0\rangle +0.8|1\rangle$. In some embodiments, the first $(2m_1-1)$ quantum gates in the first quantum-gate sequence can be deemed as a combined quantum gate (e.g., as a product matrix of the $(2m_1-1)$ matrices), and the recovery quantum gate can be the recovery quantum gate corresponding to the combined quantum gate.

Figure 2:
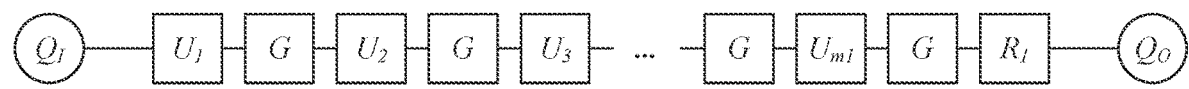
FIG. 2 is a diagram illustrating an example quantum-gate sequence, consistent with some embodiments of this disclosure.

By way of example, FIG. 2 is a diagram illustrating an example quantum-gate sequence 200, consistent with some embodiments of this disclosure. Quantum-gate sequence 200 can be the first quantum-gate sequence as described above. As illustrated in FIG. 2, quantum-gate sequence 200 includes $m_1$ random unitary quantum gates $U_1, U_2, \ldots, U_{m1}$ generated based on the parameter of a quantum gate G. Also, quantum-gate sequence 200 is generated by inserting quantum gate G between each neighboring unitary quantum gates $U_i$ and $U_{i+1}$ (with $i=1, 2, \ldots, m_1$) of the $m_1$ random unitary quantum gates, and by appending (e.g., by concatenating to $U_{m1}$) the quantum gate G and a first recovery quantum gate $R_1$ to the $m_1$ random unitary quantum gates. $R_1$ is the recovery quantum gate of a combined quantum gate $U_1 \cdot G \cdot U_2 \cdot \ldots \cdot G \cdot U_{m1} \cdot G$. Effectively, quantum-gate sequence 200 is equivalent to an identity operator, that is, $U_1 \cdot G \cdot U_2 \cdot \ldots \cdot G \cdot U_{m1} \cdot G \cdot R_1 = I$. $R_1$ can be the first recovery quantum gate as described above. In FIG. 2, quantum-gate sequence 200 is applied to an input qubit $Q_I$ (e.g., $|0\rangle$) and outputs an output qubit $Q_O$. Quantum gates of quantum-gate sequence 200 can be orderly applied to the input qubit $Q_I$, with the output qubit of each quantum gate being an input qubit for a subsequent quantum gate. If there is no infidelity in the process, after applying all of the quantum gates in quantum-gate sequence 200, the quantum state of $Q_I$ can be the same as $Q_O$.

Consistent with some embodiments of this disclosure, the method for operating a quantum circuit can also include causing the computer to determine a representation (e.g., a matrix or a tensor) of a second quantum-gate sequence by concatenating the $m_1$ random unitary quantum gates and appending (e.g., by concatenating to the end of) a second recovery quantum gate to the $m_1$ random unitary quantum gates such that the second quantum-gate sequence is equivalent to the identity operator. The second recovery quantum gate can perform transformations to a qubit to invert transformations performed by the second quantum-gate sequence onto the qubit. The net effect of applying the second quantum-gate sequence followed by the second recovery quantum gate on a qubit is equivalent to applying an identify operator (e.g., an identity Pauli gate I) onto the qubit.

Figure 3:
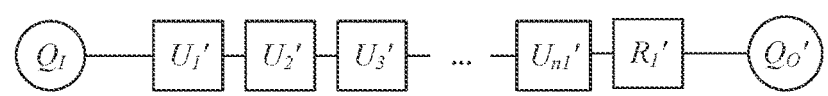
FIG. 3 is a diagram illustrating another example quantum-gate sequence, consistent with some embodiments of this disclosure.

By way of example, FIG. 3 is a diagram illustrating an example quantum-gate sequence 300, consistent with some embodiments of this disclosure. Quantum-gate sequence 300 can be the second quantum-gate sequence as described above. As illustrated in FIG. 3, quantum-gate sequence 300 includes the $n_1$ random unitary quantum gates $U'_1, U'_2, \ldots, U'_{n1}$ with $n_1$ being an integer. For example, $n_1$ can be the same or different integer as $m_1$. In some embodiments, $U'_i$ ($i=1, 2, \ldots n_1$) can be the same as or different from the unitary quantum gates $U_1, U_2, \ldots, U_{m1}$ as illustrated and described in association with FIG. 2. Also, quantum-gate sequence 300 is generated by concatenating the $n_1$ random unitary quantum gates, and by appending (e.g., by concatenating to $U_{n1}$) a second recovery quantum gate $R'_1$ to the $n_1$ random unitary quantum gates. $R'_1$ is the recovery quantum gate of a combined quantum gate $U'_1 \cdot U'_2 \cdot \ldots \cdot U'_{n1}$. $R'_1$ can be the first recovery quantum gate as described above. Effectively, quantum-gate sequence 300 is equivalent to an identity operator, that is, $U'_1 \cdot U'_2 \cdot \ldots \cdot U'_{n1} \cdot R_1 = I$. In FIG. 3, quantum-gate sequence 300 is applied to an input qubit $Q_I$ (e.g., $|0\rangle$) and outputs an output qubit $Q'_O$. Quantum gates of quantum-gate sequence 300 can be orderly applied to the input qubit $Q_I$, with the output qubit of each quantum gate being an input qubit for a subsequent quantum gate. If there is no infidelity in the process, after applying all of the quantum gates in quantum-gate sequence 300, the quantum state of $Q_I$ can be the same as $Q'_O$.

Consistent with some embodiments of this disclosure, the method for operating a quantum circuit can further include causing the computer to send, to a quantum computing device, hardware instructions corresponding to the representation of the first quantum-gate sequence and hardware instructions corresponding to the representation of the second quantum-gate sequence. In some embodiments, the computer can send the hardware instructions (e.g., represented as electronic signals encoded to carry information) to the quantum computing device via a wired or wireless connection. In some embodiments, the quantum computing device can be a physical device configured to store qubits, apply quantum gates to the qubits for operating on their quantum states, and measure the qubits after applying the quantum gates, in accordance with provided hardware instructions. In some embodiments, the computer can code or compile the representation (e.g., a matrix or tensor) into the hardware instructions.

For example, the quantum computing device can be a superconducting quantum computing device that stores one or more superconducting qubits (e.g., a transmon qubit) and is coupled to an external electromagnetic signal oscillator to receive microwave pulse signals for changing the quantum states of the superconducting qubits. By way of example, with reference to FIG. 1, a superconducting qubit in such a quantum computing device can be represented as a qubit $|\psi\rangle$ represented in Bloch sphere 100. If the computer (e.g., a classical computer) sends hardware instructions corresponding to a Pauli X gate to the quantum computing device, the quantum computing device can cause the electromagnetic signal oscillator to generate a microwave pulse signal in accordance with the hardware instructions, and the microwave pulse signal can cause the qubit $|\psi\rangle$ to flip 180° around the x-axis of Block sphere 100.

In some embodiments, the quantum computing device can be independent of the computer (e.g., a classical computer) that sends the hardware instructions. In some embodiments, the quantum computing device can be an integral part of the computer (e.g., a computer system that integrates classical computing devices and quantum computing devices).

Consistent with some embodiments of this disclosure, the method for operating a quantum circuit can further include causing the computer to receive, from the quantum computing device, a first number of measurements of a qubit (e.g., a superconducting qubit) after applying the first quantum-gate sequence to the qubit for the first number of times by the quantum computing device and a second number of measurements of the qubit after applying the second quantum-gate sequence to the qubit for the second number of times by the quantum computing device. For example, the first number and the second number can be the same or different number. In some embodiments, the computer can receive the first number of measurements and the second number of measurements (e.g., both represented as electronic signals encoded to carry information) from the quantum computing device via a wired or wireless connection.

By way of example, with reference to FIG. 2, the quantum computing device can apply each quantum gate in the first quantum-gate sequence (e.g., quantum-gate sequence 200) in accordance with the hardware instructions to the input qubit $Q_I$ for N times (N being an integer). In each time of the application of the first quantum-gate sequence, the output qubit of each quantum gate (e.g., $U_1$, G, $U_2$, G, ..., G, $U_{m1}$, G) is an input qubit for a subsequent quantum gate. After the application of the first quantum-gate sequence, the quantum computing device can measure the output qubit $Q_O$ to obtain a measurement (e.g., a definite state of $Q_O$). After the measurement, the quantum computing device can re-prepare the input qubit $Q_I$, apply quantum-gate sequence 200 to it, and measure the output qubit $Q_O$ to obtain a new measurement again. The quantum computing device can iterate such a process for N times, ultimately yielding N measurements of $Q_O$. If no infidelity occurs in an iteration, the measurement of $Q_O$ of that iteration should have the same quantum state as that of the input qubit $Q_I$. If error occurs in an iteration, the measurement of $Q_O$ of that iteration should have a quantum state different from that of the input qubit $Q_I$.

By way of example, with reference to FIG. 3, the quantum computing device can apply each quantum gate in the second quantum-gate sequence (e.g., quantum-gate sequence 300) in accordance with the hardware instructions to the input qubit $Q_I$ for M times (M being an integer, either the same or different from N). In each time of the application of the second quantum-gate sequence the output qubit of each quantum gate (e.g., $U_1$, $U_2$, ..., $U_{m1}$) is an input qubit for a subsequent quantum gate. After the application of the second quantum-gate sequence, the quantum computing device can measure the output qubit $Q'_O$ to obtain a measurement (e.g., a definite state of $Q'_O$). After the measurement, the quantum computing device can re-prepare the input qubit $Q_I$, apply quantum-gate sequence 300 to it, and measure the output qubit $Q'_O$ to obtain a new measurement again. The quantum computing device can iterate such a process for N times, ultimately yielding N measurements of $Q'_O$. If no infidelity occurs in an iteration, the measurement of $Q'_O$ of that iteration should have the same quantum state as that of the input qubit $Q_I$. If error occurs in an iteration, the measurement of $Q'_O$ of that iteration should have a quantum state different from that of the input qubit $Q_I$.

Consistent with some embodiments of this disclosure, the method for operating a quantum circuit can further cause the computer to determine a fidelity value of the quantum gate based on a first probability that a quantum state of the qubit is unchanged over the first number of measurements of the qubit and a second probability that the quantum state of the qubit is unchanged over the first number of measurements of the qubit. A fidelity value in this disclosure can include a value representing the fidelity of the quantum gate. For example, the fidelity value can be a percentage value (e.g., the probability itself). In some embodiments, the computer can determine the fidelity value of the quantum gate as a ratio of the first probability over the second probability.

By way of example, if the computer receives 100 first measurements of the qubit, 96 of which indicate that the quantum state of the qubit is unchanged after applying the first quantum-gate sequence (e.g., quantum-gate sequence 200 in FIG. 2) to the qubit (e.g., $Q_I$ in FIG. 2) for 100 times, then the first probability can be determined as 96%. If the computer receives 200 second measurements of the qubit, 196 of which indicate that the quantum state of the qubit is unchanged after applying the second quantum-gate sequence (e.g., quantum-gate sequence 300 in FIG. 2) to the qubit (e.g., $Q_I$ in FIG. 3) for 200 times, then the second probability can be determined as 98%. Based on the first probability 96% and the second probability 98%, the fidelity value of the quantum gate (e.g., G in FIG. 2) can be 97.96%=96%/98%.

Consistent with some embodiments of this disclosure, after determining the fidelity value, the method for operating a quantum circuit can further cause the computer to update the parameter of the quantum gate based on the fidelity value of the quantum gate. In some embodiments, based on a determination that the qubit is a superconducting qubit, that the quantum gate is an electromagnetic signal (e.g., a microwave pulse signal), and that the parameter of the quantum gate is at least one of a length, an amplitude, or a shape of the electromagnetic signal, the computer can update the parameter by modifying at least one of the length, the amplitude, or the shape of the electromagnetic signal. In some embodiments, the computer can update the parameter to optimize the quantum gate such that the fidelity value can be increased if the quantum gate is applied with the new parameter in effect.

Consistent with some embodiments of this disclosure, the method for operating a quantum circuit can further include operations to determine the fidelity value using different quantum-gate sequences having different length of generated random unitary quantum gates. In some embodiments, the method can cause the computer to generate representations (e.g., matrices or tensors) of $m_1$ ($m_2$ being an integer different from $m_1$) random unitary quantum gates based on the parameter of the quantum gate. The method can further cause the computer to determine a representation (e.g., a matrix or a tensor) of a third quantum-gate sequence by inserting the quantum gate between each neighboring unitary quantum gates of the $m_2$ random unitary quantum gates and appending the quantum gate and a third recovery quantum gate to the $m_2$ random unitary quantum gates such that the third quantum-gate sequence is equivalent to the identity operator.

In some embodiments, to generate the representations of $m_2$ random unitary quantum gates, the method can include causing the computer to generate the representations of $m_2$ random unitary quantum gates in accordance with a Haar measure. For example, the computer can randomly sample a unitary matrix from a group of unitary matrices conforming to the Haar measure for $m_2$ times to generate the $m_2$ random unitary quantum gates. In some embodiments, to generate the representations of $m_2$ random unitary quantum gates, the method can include causing the computer to generate the representations of $m_2$ random unitary quantum gates by pseudo-random sampling a space of unitary operators in accordance with a uniform probability distribution. It should be noted that, the generated $m_1$ random unitary quantum gates are not limited to Clifford gates or any other type of quantum gates.

Figure 4:
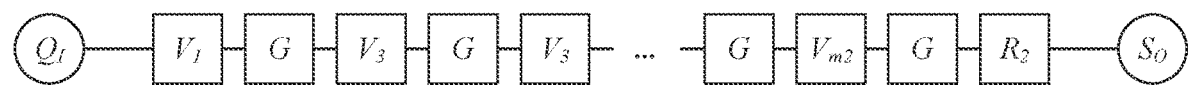
FIG. 4 is a diagram illustrating yet another example quantum-gate sequence, consistent with some embodiments of this disclosure.

By way of example, FIG. 4 is a diagram illustrating an example quantum-gate sequence 400, consistent with some embodiments of this disclosure. Quantum-gate sequence 400 can be the third quantum-gate sequence as described above. As illustrated in FIG. 4, quantum-gate sequence 400 includes $m_2$ random unitary quantum gates $V_1, V, \ldots, V_{m2}$ generated based on the parameter of a quantum gate G. Also, quantum-gate sequence 400 is generated by inserting quantum gate G between each neighboring unitary quantum gates $V_i$ and $V_{i+1}$ (with i=1, 2, . . . , $m_2$) of the $m_1$ random unitary quantum gates, and by appending (e.g., by concatenating to $V_{m2}$) the quantum gate G and a third recovery quantum gate $R_2$ to the $m_2$ random unitary quantum gates. $R_2$ is the recovery quantum gate of a combined quantum gate $V_1 \cdot G \cdot V_2 \cdot \ldots \cdot G \cdot V_{m2} \cdot G$. Effectively, quantum-gate sequence 400 is equivalent to an identity operator, that is, $V_1 \cdot G \cdot V_2 \cdot \ldots \cdot G \cdot V_{m2} \cdot G \cdot R_2 = I$. In FIG. 4, quantum-gate sequence 400 is applied to the input qubit $Q_I$ and outputs the output qubit $S_O$. Quantum gates of quantum-gate sequence 400 can be orderly applied to the input qubit $Q_I$, with the output qubit of each quantum gate being an input qubit for a subsequent quantum gate. If there is no infidelity in the process, after applying all of the quantum gates in quantum-gate sequence 400, the quantum state of $Q_I$ can be the same as $S_O$.

In some embodiments, the method can further cause the computer to determine a representation (e.g., a matrix or a tensor) of a fourth quantum-gate sequence by concatenating the $m_2$ random unitary quantum gates and appending a fourth recovery quantum gate to the $m_2$ random unitary quantum gates such that the fourth quantum-gate sequence is equivalent to the identity operator.

Figure 5:
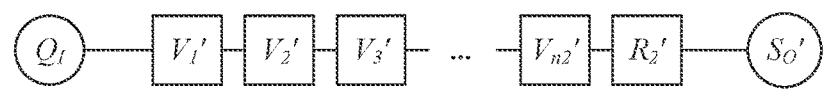
FIG. 5 is a diagram illustrating yet another example reference quantum-gate sequence, consistent with some embodiments of this disclosure.

By way of example, FIG. 5 is a diagram illustrating an example quantum-gate sequence 500, consistent with some embodiments of this disclosure. Quantum-gate sequence 500 can be the fourth quantum-gate sequence as described above. As illustrated in FIG. 5, quantum-gate sequence 500 includes the $n_2$ random unitary quantum gates $V'_1, V'_2, \ldots, V'_{n2}$ with $n_2$ being an integer. In some embodiments, $n_2$ can be the same or different integer as $m_2$. In some embodiments, $V'_i$ (i=1, 2, . . . $n_2$) can be the same as or different from the unitary quantum gates $V_1, V, \ldots, V_{m2}$ as illustrated and described in association with FIG. 4. Also, quantum-gate sequence 500 is generated by concatenating the $n_2$ random unitary quantum gates $V'_1, V'_2, \ldots, V'_{n2}$ and appending (e.g., by concatenating to $V_{n2}$) a fourth recovery quantum gate $R'_2$ to the $n_2$ random unitary quantum gates. $R'_2$ is the recovery quantum gate of a combined quantum gate $V'_1 \cdot V'_1 \cdot \ldots \cdot V'_{n2}$. Effectively, quantum-gate sequence 500 is equivalent to an identity operator, that is, $V'_1 \cdot V'_2 \cdot \ldots \cdot V'_{n2} \cdot R_2 = I$. In FIG. 5, quantum-gate sequence 500 is applied to the input qubit $Q_I$ and outputs the output qubit $S'_O$. Quantum gates of quantum-gate sequence 500 can be orderly applied to the input qubit $Q_I$, with the output qubit of each quantum gate being an input qubit for a subsequent quantum gate. If there is no infidelity in the process, after applying all of the quantum gates in quantum-gate sequence 500, the quantum state of $Q_I$ can be the same as $S'_O$.

In some embodiments, the method can further cause the computer to send, to the quantum computing device, hardware instructions corresponding to the representation of the third quantum-gate sequence and hardware instructions corresponding to the representation of the fourth quantum-gate sequence. After that, the method can further cause the computer to receive, from the quantum computing device, a third number of measurements of the qubit after applying the third quantum-gate sequence to the qubit for the third number of times by the quantum computing device and a fourth number of measurements of the qubit after applying the fourth quantum-gate sequence to the qubit for the fourth number of times by the quantum computing device. For example, the first number and the third number can be the same or different number. In another example, the third number and the fourth number can be the same or different number. In some embodiments, the computer can receive the third number of measurements (e.g., represented as electronic signals encoded to carry information) from the quantum computing device via a wired or wireless connection. In some embodiments, the quantum computing device can determine the third number of measurements and the fourth number of measurements in operations similar to determining the first number of measurements and the second number of measurements, respectively, which has been described and will not be repeated hereinafter.

After receiving the third number of measurements and the fourth number of measurements of the qubit, the method can further cause the computer to determine a third probability that the quantum state of the qubit is unchanged over the third number of measurements of the qubit and a fourth probability that the quantum state of the qubit is unchanged over the fourth number of measurements of the qubit. In some embodiments, the computer can determine the third probability and the fourth probability by operations similar to determining the first probability and the second probability, respectively, which has been described and will not be repeated hereinafter.

After determining the third probability and the fourth probability, the method can further cause the computer to determine an average fidelity value of the quantum gate based on the first probability, the second probability, the third probability, and the fourth probability. In some embodiments, to determine the average fidelity value, the computer can determine a first average probability as an average of the first probability and the third probability, and a second average probability as an average of the second probability and the fourth probability, and determine the average fidelity value as a ratio of the first average probability over the second average probability.

By way of example, if the computer receives 100 first measurements of the qubit, 96 of which indicate that the quantum state of the qubit is unchanged after applying the first quantum-gate sequence (e.g., quantum-gate sequence 200 in FIG. 2) to the qubit (e.g., $Q_I$ in FIG. 2) for 100 times, then the first probability can be determined as 96%. If the computer receives 200 second measurements of the qubit, 196 of which indicate that the quantum state of the qubit is unchanged after applying the second quantum-gate sequence (e.g., quantum-gate sequence 300 in FIG. 2) to the qubit (e.g., $Q_I$ in FIG. 3) for 200 times, then the second probability can be determined as 98%. If the computer receives 300 third measurements of the qubit, 285 of which indicate that the quantum state of the qubit is unchanged after applying the third quantum-gate sequence (e.g., quantum-gate sequence 400 in FIG. 4) to the qubit (e.g., $Q_I$ in FIG. 4) for 300 times, then the third probability can be determined as 95%. If the computer receives 400 fourth measurements of the qubit, 388 of which indicate that the quantum state of the qubit is unchanged after applying the fourth quantum-gate sequence (e.g., quantum-gate sequence 500 in FIG. 5) to the qubit (e.g., $Q_I$ in FIG. 5) for 388 times, then the fourth probability can be determined as 97%. Based on the first probability 96%, the second probability 98%, the third probability 95%, and the fourth probability 97%, the computer can determine the first average probability as 95.5%=(96%+95%)/2 and the second average probability as 97.5%=(98%+97%)/2. Then, the computer can determine the fidelity value of the quantum gate (e.g., G in FIG. 2 and FIG. 4) as 97.95%=95.5%/97.5%.

In some embodiments, the computer can determine the average fidelity value of the quantum gate using exponential decay regressions. The computer can determine a first fidelity value by performing a first exponential decay regression using $m_1$ and $m_2$ as independent variables, and the first probability and the third probability as response variables. The computer can then determine a second fidelity value by performing a second exponential decay regression using $m_1$ and $m_2$ are independent variables, and using the second probability and the fourth probability as response variables. The computer can further determine the average fidelity value as a ratio of the first fidelity value over the second fidelity value.

By way of example, the computer can perform the first exponential decay regression by fitting Eq. (1):

$$p(m)=Au^m+B \qquad \text{Eq. (1)}$$

In Eq. (1), m represents the number of random quantum gates in quantum-gate sequences (e.g., $m_1+1$ for the first quantum-gate sequence and $m_2+1$ for the third quantum-gate sequence), and p(m) represents a probability (e.g., the first probability or the third probability) that a quantum state of a qubit (e.g., $Q_I$ in FIG. 2 or FIG. 4) is unchanged under a plurality of measurements (e.g., the first number of measurements or the third number of measurements) by a quantum-gate sequence (e.g., quantum-gate sequence 200 in FIG. 2 or quantum-gate sequence 400 in FIG. 4) having m (e.g., $m_1+1$ or $m_2+1$) random quantum gates. Quantity u represents a fidelity value of the quantum-gate sequence as a whole. Parameters A and B can capture information of SPAM errors. After fitting Eq. (1) using multiple values of m and p(m), the computer can determine a value of the quantity u.

By way of example, the computer can perform the first exponential decay regression by fitting Eq. (2):

$$p'(m)=A'v^m+B' \qquad \text{Eq. (2)}$$

In Eq. (2), m has the same meaning as the m in Eq. (1). p'(m) represents a probability (e.g., the second probability or the fourth probability) that a quantum state of a qubit (e.g., $Q_I$ in FIG. 3 or FIG. 5) is unchanged under a plurality of measurements (e.g., the second number of measurements or the fourth number of measurements) by a quantum-gate sequence (e.g., quantum-gate sequence 300 in FIG. 3 or quantum-gate sequence 500 in FIG. 5) having m (e.g., $m_1+1$ or $m_2+1$) random quantum gates. Quantity v represents a fidelity value of the quantum-gate sequence as a whole. Parameters A' and B' can capture information of SPAM errors. After fitting Eq. (2) using multiple values of m and p'(m), the computer can determine a value of the quantity v. After determining the quantities u and v, the computer can further determine the average fidelity value as $$\frac{u}{v}.$$

In some embodiments, after determining the average fidelity value of the quantum gate, the method for operating a quantum circuit can further cause the computer to update the parameter of the quantum gate based on the average fidelity value of the quantum gate.

Figure 6:
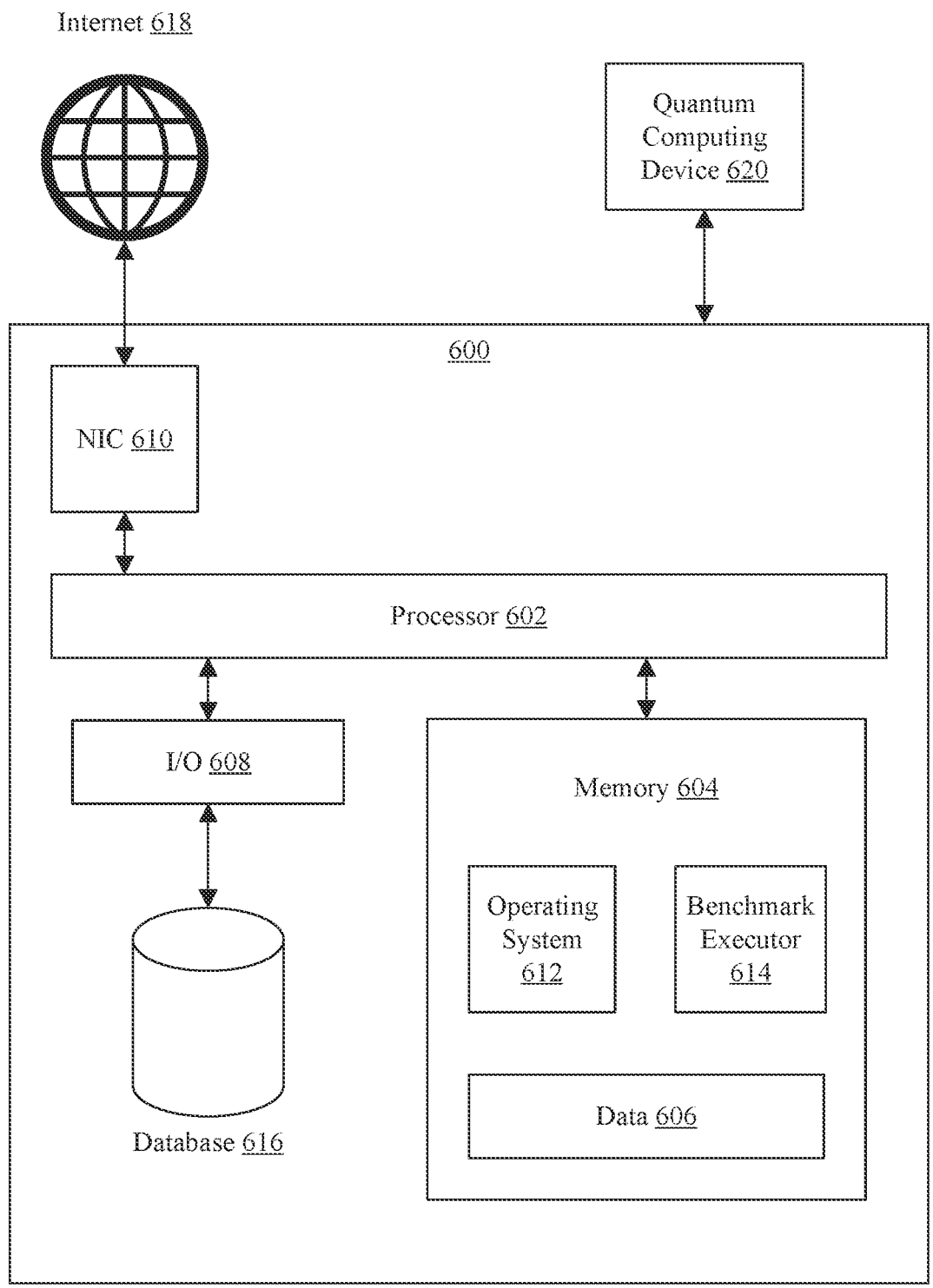
FIG. 6 is a block diagram of an example system for operating a quantum circuit, consistent with some embodiments of this disclosure.

Consistent with some embodiments of this disclosure, FIG. 6 is a block diagram of an example system 600 for operating a quantum circuit, consistent with some embodiments of this disclosure. In some embodiments, system 600 can include a computer (e.g., a classical computer) configured to execute operations for operating a quantum circuit as described in association with FIGS. 1-5. As depicted in FIG. 6, system 600 includes a processor 602 that can be in operable connection with a memory 604, an input/output (I/O) module 606, and a network interface controller (NIC) 610.

When processor 602 executes instructions described herein, system 600 can become a specialized machine for benchmarking a quantum circuit. Processor 602 can be any type of circuitry capable of manipulating or processing information. For example, processor 602 can include any combination of any number of a central processing unit (or "CPU"), a graphics processing unit (or "GPU"), a neural processing unit ("NPU"), a microcontroller unit ("MCU"), an optical processor, a programmable logic controller, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), or the like. In some embodiments, processor 602 can also be a set of processors (not shown in FIG. 6) grouped as a single logical component.

Memory 604 can include a single memory or a plurality of memories that can be configured to store data 606 (e.g., a set of instructions, computer codes, intermediate data, or data for output). Memory 604 can include a high-speed random-access storage device or a non-volatile storage device. In some embodiments, memory 604 can include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or the like. Memory 604 can also be a group of memories (not shown in FIG. 6) grouped as a single logical component. Processor 602 can access the program instructions and data 606, and execute the program instructions to perform an operation or manipulation on data 606. As depicted in FIG. 6, memory 604 can store an operating system 612 and a benchmark executor 614. For example, benchmark executor 614 can include instructions to implement the method described in association with FIGS. 1-5 to benchmark a quantum circuit.

For ease of explanation without causing ambiguity, processor 602 and other data processing circuits are collectively referred to as a "data processing circuit" in this disclosure. The data processing circuit can be implemented entirely as hardware, or as a combination of software, hardware, or firmware. In addition, the data processing circuit can be a single independent module or can be combined entirely or partially into any other component of system 600.

Input/output module (I/O) 608 can store and retrieve data from a database 616. For example, database 616 can include data structures describing quantum circuits and data structures describing quantum gates. NIC 610 can provide wired or wireless communication between system 600 and a network (e.g., Internet 618, an intranet, a local area network, a mobile communications network, or the like). System 600 can receive data and instructions over a network using NIC 610 and can transmit data and instructions over a network using NIC 610. In some embodiments, NIC 610 can include any combination of a radio frequency (RF) module, a transponder, a transceiver, a modem, a router, a gateway, a wired network adapter, a wireless network adapter, a Bluetooth adapter, an infrared adapter, a near-field communication ("NFC") adapter, or a cellular network chip.

As depicted in FIG. 6, system 600 can also communicatively couple with (e.g., via I/O 608 or NIC 610) a quantum computing device 620. In some embodiments, system 600 can be a classical computer (e.g., a desktop computer, a laptop computer, or a tablet computer) that is independent from quantum computing device 620. In some embodiments, system 600 can include classical computing devices (e.g., processor 602, memory 604, I/O 608, NIC 610, or database 616) and quantum computing devices (e.g., including quantum computing device 620). Quantum computing device 620 can include any number of any type of quantum circuits (that include quantum gates) for operating on qubits as well as peripheral devices (e.g., cryostats, laser generators, electric oscillators) for maintaining and supporting the quantum circuits. In some embodiments, quantum computing device 620 can include hardware components functioning as a quantum data plane for preparing and storing qubits, a control and measurement plane for executing operations on the qubits and measuring the resulting qubits, and a control processor plane for determining the sequence of operations and measurements based on an algorithm or measurement outcomes. When system 600 is a classical computer, it can assist quantum computing device 620 for network access (e.g., via NIC 610), large storages (e.g., using database 610), and user interactions (e.g., via I/O 608).

Figure 7:
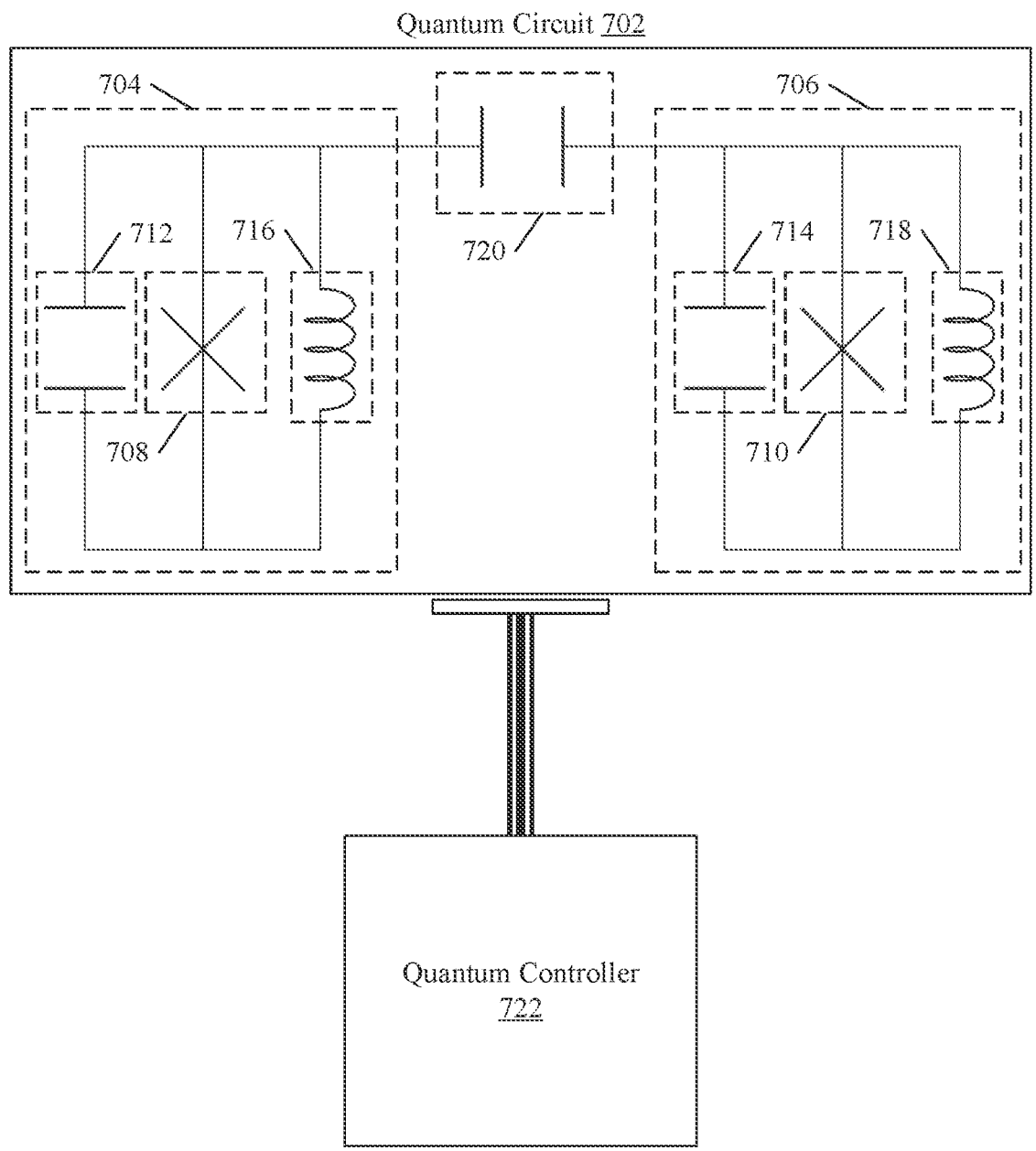
FIG. 7 is a schematic diagram illustrating an example quantum controller for operating quantum circuits, consistent with some embodiments of this disclosure.

Consistent with some embodiments of this disclosure, FIG. 7 is a schematic diagram illustrating an example quantum controller 722 for operating (e.g., benchmarking, controlling qubits for computation, controlling qubits for compiling, or any manipulation of qubit) quantum circuits (e.g., quantum circuit 702, as shown). Quantum circuit 702 can include one or more qubits. In the non-limiting example depicted in FIG. 7, quantum circuit 702 can include qubits 704 and 706. For example, qubits 704 and 706 can be fluxonium qubits. To continue this example, each of qubits 704 and 706 can be implemented using a Josephson junction (e.g., Josephson junction 708 or 710) shunted by a capacitor (e.g., capacitor 712 or 714) and an inductor (e.g., inductor 716 or 718). Each of inductors 716 and 718 can be realized by an array of Josephson junctions (not shown in FIG. 7). Each of qubits 706 and 706 can be constructed to operate at a local minimum in frequency with regards to a biasing magnetic flux. In this non-limiting example, qubits 704 and 706 can be coupled using a capacitor 720, implementing transverse resonant coupling (e.g., charge-coupled, or the like) between qubits 706 and 706. Such coupling can require alignment of the qubit frequencies. When quantum circuit 702 is not in operation, qubits 704 and 706 can be maintained as different frequencies.

In some embodiments, quantum circuit 702 can be realized using a chip containing qubits 704 and 706 as well as their coupling in between. In some embodiments, quantum circuit 702 can be implemented as a chip in quantum computing device 620 in FIG. 6.

In some embodiments, the chip can include one of more couplings to a quantum controller 722. Quantum controller 722 can be a digital computing device (e.g., a computing device including a central processing unit, graphical processing unit, application specific integrated circuit, field-programmable gate array, or other suitable processor). Quantum controller 722 can configure quantum circuit 702 for computation (e.g., by manipulating qubits 704 and 706), provide computational gates, or read state information out of quantum circuit 702.

Consistent with some embodiments of this disclosure, quantum controller 722 can configure quantum circuit 702 by enabling a gate operation to be performed on one or more qubits of circuit quantum 702 (e.g., including qubits 704 and 706). In some embodiments, quantum circuit 702 can be configured by providing one or more bias drives to move two qubits into resonance. Quantum controller 722 can provide the one or more bias drives directly to circuit 702, or can provide instructions to a bias drive source (e.g., waveform generator or the like), causing the bias drive source to provide the bias drives to circuit 702. In some embodiments, providing the bias drive can include passing a current through a coil external to circuit 702. In various embodiments, providing the bias drive can include passing a current through a coil on the chip. The disclosed embodiments are not limited to a particular method of providing the bias drive or a particular method of biasing the qubits.

Consistent with some embodiments of this disclosure, quantum controller 722 can implement computational gates on circuit 702. Quantum controller 722 can implement such gates by providing one or more computational drives to corresponding qubits in circuit 702, or by providing instructions to a computation drive source (e.g., a waveform generator or the like), causing the computational drive source to provide the one or more computational drives to circuit 702. Such computational drives can include microwave drives. The computational drives can include sinusoidal waves, square waves, pulse trains, or other quantum gate drives having parameters selected by the quantum controller 722 to implement quantum gates on the qubits. The one or more computational drives can be provided to the corresponding qubits using one or more coils coupled to the corresponding qubits. The coils can be external to circuit 702 or on a chip containing circuit 702.

Consistent with some embodiments of this disclosure, quantum controller 722 can be configured to determine state information for quantum circuit 702. In some embodiments, quantum controller 722 can measure a state of one or more qubits of circuit 702. The state can be measured upon completion of a sequence of one or more quantum operations. In some embodiments, quantum controller 722 can provide a probe signal (e.g., a microwave probe tone) to a coupled resonator of circuit 702, or provide instructions to a readout device (e.g., an arbitrary waveform generator) that provides the probe signal. In various embodiments, quantum controller 722 can include, or be configured to receive information from, a detector configured to determine an amplitude and phase of an output signal received from the coupled resonator in response to provision of the microwave probe tone. The amplitude and phase of the output signal can be used to determine the state of the probed qubit(s). The disclosed embodiments are not limited to any particular method of measuring the state of the qubits.

The disclosed embodiments are not limited to embodiments in which quantum controller 722 controls only a single quantum circuit. In some embodiments, quantum controller 722 can control multiple quantum circuits (which can be identical in implementation or can differ in implementation). For example, quantum controller 722 can control a first, transmon-qubit-based quantum circuit and a second, fluxonium-qubit-based quantum circuit. In some embodiments, quantum controller 722 can be capable of independently controlling the multiple quantum circuits. In some instances, for example, each of the multiple quantum circuits can be performing different, contemporaneous computations. In various instances, the multiple quantum circuit can be involved in the same computation (e.g., parallel computations, or the like).

Consistent with some embodiments of this disclosure, quantum controller 722 can configure quantum circuit 702, and can provide computational gates to circuit 702, based at least in part on the obtained state information. In some embodiments, quantum controller 722 can be included as part of computing device 620 in FIG. 6.

Figure 8:
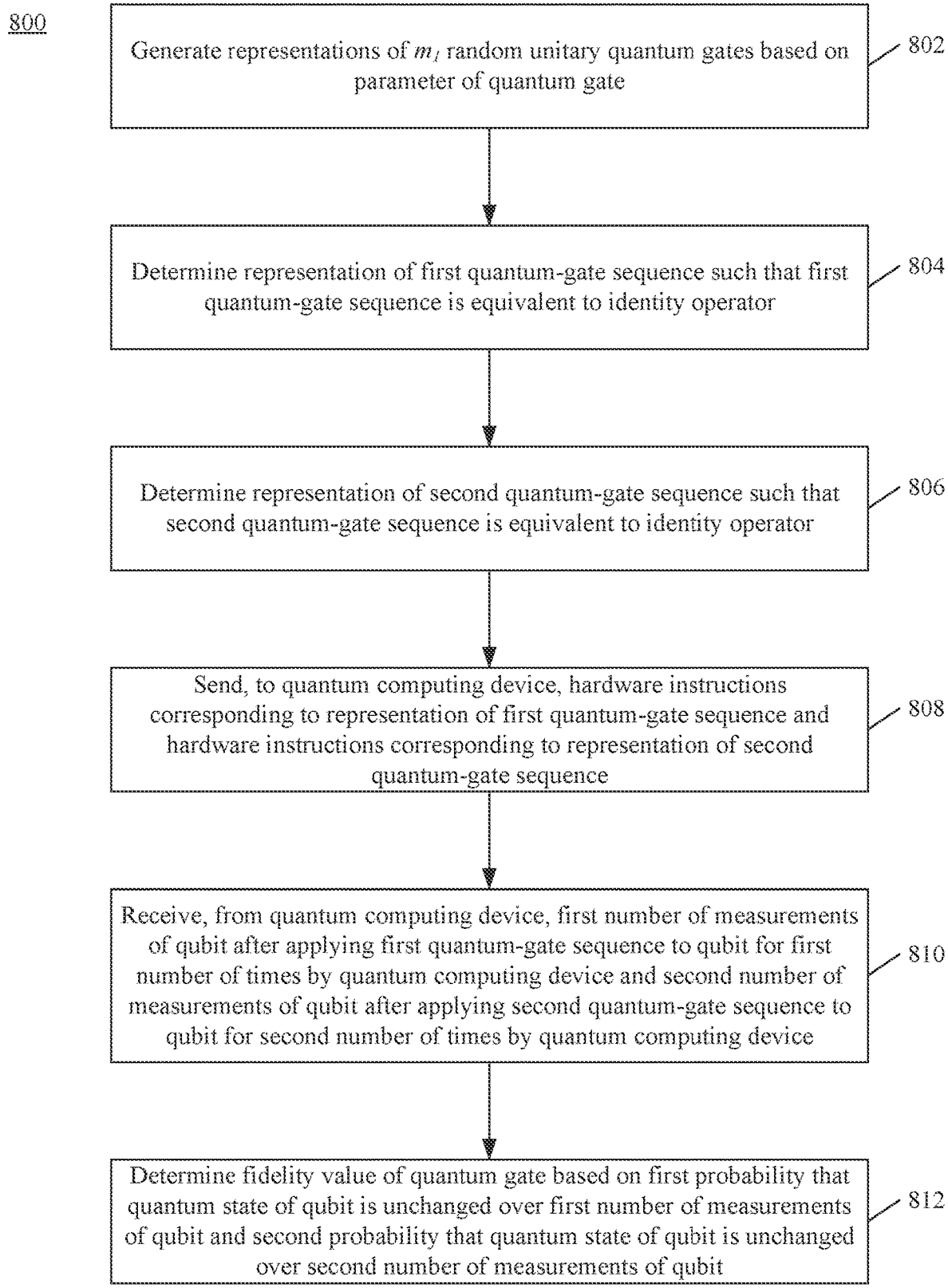
FIG. 8 illustrate a flowchart of an example method for operating a quantum circuit, consistent with some embodiments of this disclosure.

By way of example, FIG. 8 illustrate a flowchart of an example method 800 for operating a quantum circuit, consistent with some embodiments of this disclosure. Method 800 can be performed by at least one data processing circuit (e.g., processor 602 in FIG. 6). In some embodiments, method 800 can be implemented as a computer program product (e.g., embodied in a computer-readable medium) that includes computer-executable instructions (e.g., program codes) to be executed by a computer (e.g., system 600 in FIG. 6). In some embodiments, method 800 can be implemented as a hardware product (e.g., benchmark executor 614 in FIG. 6) that stores computer-executable instructions (e.g., program codes), and the hardware product can be a standalone or integrated part of any of system 600.

Referring to FIG. 8, at step 802, a data processing circuit (e.g., a data processing circuit of a classical computer) can generate representations (e.g., matrices or tensors) of $m_1$ ($m_1$ being an integer) random unitary quantum gates (e.g., the unitary quantum gates $U_1, U_2, \ldots, U_{m1}$ in FIG. 2) based on a parameter of a quantum gate (e.g., the quantum gate G in FIG. 2). In some embodiments, the quantum gate can be implemented as an electromagnetic signal (e.g., a microwave pulse signal generated by an external oscillator). In such cases, the parameter of the quantum gate can include at least one of a length, an amplitude, or a shape of the electromagnetic signal.

In some embodiments, to generate the representations of $m_1$ random unitary quantum gates, the data processing circuit can generate the representations of $m_1$ random unitary quantum gates in accordance with a Haar measure. In some embodiments, the data processing circuit can generate the representations of $m_1$ random unitary quantum gates by pseudo-random sampling a space of unitary operators in accordance with a uniform probability distribution. It should be noted that, the generated $m_1$ random unitary quantum gates are not limited to Clifford gates or any other type of quantum gates.

At step 804, the data processing circuit can determine a representation (e.g., a matrix or a tensor) of a first quantum-gate sequence (e.g., quantum-gate sequence 200 in FIG. 2) by inserting the quantum gate (e.g., the quantum gate G in FIG. 2) between each neighboring unitary quantum gates (e.g., unitary quantum gates $U_i$ and $U_{i+1}$ with i=1, 2, . . . , $m_1$ in FIG. 2) of the $m_1$ random unitary quantum gates and appending (e.g., by concatenating to $U_{m1}$ in FIG. 2) the quantum gate and a first recovery quantum gate (e.g., first recovery quantum gate $R_1$ in FIG. 2) to the $m_1$ random unitary quantum gates such that the first quantum-gate sequence is equivalent to an identity operator (e.g., an identity Pauli gate 1). By way of example, as depicted in FIG. 2, $R_1$ can be the recovery quantum gate of a combined quantum gate $U_1 \cdot G \cdot U_2 \cdot \ldots \cdot G U_{m1} \cdot G$. Effectively, quantum-gate sequence 200 in FIG. 2 can be equivalent to an identity operator, that is, $U_1 \cdot G \cdot U_2 \cdot \ldots \cdot G \cdot U_{m1} \cdot G \cdot R_1 = I$.

At step 806, the data processing circuit can determine a representation (e.g., a matrix or a tensor) of a second quantum-gate sequence (e.g., quantum-gate sequence 300 in FIG. 3) by concatenating the m1 random unitary quantum gates and appending (e.g., by concatenating to $U_{m1}'$ in FIG. 3) a second recovery quantum gate (e.g., second recovery quantum gate $R_1'$ in FIG. 3) to the $m_1$ random unitary quantum gates such that the second quantum-gate sequence is equivalent to the identity operator (e.g., an identity Pauli gate I). By way of example, as depicted in FIG. 3, $R_1'$ can be the recovery quantum gate of a combined quantum gate $U'_1 \cdot U' \cdot U'_{n1}$. Effectively, quantum-gate sequence 300 in FIG. 3 can be equivalent to an identity operator, that is, $U'_1 \cdot U'_2 \cdot \ldots \cdot U'_{n1} \cdot R'_1 = I$.

At step 808, the data processing circuit can send (e.g., via NIC 610 in FIG. 6), to a quantum computing device (e.g., quantum computing device 620 in FIG. 6), hardware instructions corresponding to the representation of the first quantum-gate sequence. In some embodiments, the quantum computing device can include a quantum circuit (e.g., quantum circuit 702 in FIG. 7) and a quantum controller (e.g., quantum controller 722 in FIG. 7) configured to operate the quantum circuit. The quantum circuit can include the qubit (e.g., qubit 704 or 706 in FIG. 7).

At step 810, the data processing circuit can receive (e.g., via NIC 610 in FIG. 6), from the quantum computing device, a first number of measurements of a qubit (e.g., the output qubit $Q_O$ in FIG. 2) after applying the first quantum-gate sequence (e.g., quantum-gate sequence 200) to the qubit (e.g., the input qubit $Q_I$ in FIG. 2) for the first number of times by the quantum computing device. In some embodiments, the qubit can be implemented as a superconducting qubit.

At step 812, the data processing circuit can determine a fidelity value of the quantum gate based on a probability that a quantum state of the qubit is unchanged over the first number of measurements of the qubit.

Consistent with some embodiments of this disclosure, after determining the fidelity value, the data processing circuit can further update the parameter of the quantum gate based on the fidelity value of the quantum gate. In some embodiments, the computer can update the parameter to optimize the quantum gate such that the fidelity value can be increased if the quantum gate is applied with the new parameter in effect.

Consistent with some embodiments of this disclosure, after determining the fidelity value, the data processing circuit can further generate representations (e.g., matrices or tensors) of $m_2$ ($m_2$ being an integer different from $m_1$) random unitary quantum gates (e.g., the unitary quantum gates $V_1, V, \ldots, V_{m2}$ in FIG. 4) based on the parameter of the quantum gate (e.g., the quantum gate G in FIG. 4). The data processing circuit can then determine a representation (e.g., a matrix or a tensor) of a second quantum-gate sequence (e.g., quantum-gate sequence 400 in FIG. 4) by inserting the quantum gate (e.g., the quantum gate G in FIG. 4) between each neighboring unitary quantum gates (e.g., unitary quantum gates $V_i$ and $V_{i+1}$ with i=1, 2, . . . , $m_2$ in FIG. 4) of the $m_2$ random unitary quantum gates and appending (e.g., e.g., by concatenating to $V_{m2}$ in FIG. 4) the quantum gate and a second recovery quantum gate (e.g., second recovery quantum gate $R_2$ in FIG. 4) to the $m_2$ random unitary quantum gates such that the second quantum-gate sequence is equivalent to the identity operator (e.g., an identity Pauli gate I). By way of example, as depicted in FIG. 4, $R_2$ can be the recovery quantum gate of a combined quantum gate $V_1 \cdot G \cdot V_2 \cdot \ldots \cdot G \cdot V_{m2} \cdot G$. Effectively, quantum-gate sequence 400 in FIG. 4 is equivalent to an identity operator, that is, $V_1 \cdot G \cdot V_2 \cdot \ldots \cdot G \cdot V_{m2} \cdot G \cdot R_2 = I$.

In some embodiments, to generate the representations of $m_2$ random unitary quantum gates, the method can include causing the computer to generate the representations of $m_2$ random unitary quantum gates in accordance with a Haar measure. In some embodiments, to generate the representations of $m_2$ random unitary quantum gates, the method can include causing the computer to generate the representations of $m_2$ random unitary quantum gates by pseudo-random sampling a space of unitary operators in accordance with a uniform probability distribution. It should be noted that, the generated $m_2$ random unitary quantum gates are not limited to Clifford gates or any other type of quantum gates.

After determining the representation of the second quantum-gate sequence, the data processing circuit can further send (e.g., via NIC 610 in FIG. 6), to the quantum computing device (e.g., quantum computing device 620 in FIG. 6), hardware instructions corresponding to the representation of the second quantum-gate sequence. After that, the data processing circuit can receive (e.g., via NIC 610 in FIG. 6), from the quantum computing device, the second number of measurements of the qubit (e.g., the output qubit $Q_O$ in FIG. 4) after applying the second quantum-gate sequence (e.g., quantum-gate sequence 400) to the qubit (e.g., the input qubit $Q_I$ in FIG. 4) for the second number of times by the quantum computing device. After receiving the second number of measurements of the qubit, the data processing circuit can determine a second fidelity value of the quantum gate based on a probability that the quantum state of the qubit is unchanged over the second number of measurements of the qubit.

After determining the second fidelity value, the data processing circuit can determine an average fidelity value of the quantum gate based on the fidelity value and the second fidelity value. In some embodiments, the computer can determine the average fidelity value as an average of the fidelity value and the second fidelity value. In some embodiments, the data processing circuit can determine the average fidelity value of the quantum gate by performing an exponential decay regression, in which $m_1$ and $m_2$ are independent variables, and the fidelity value and the second fidelity value are response variables. The computer can further determine the average fidelity value as a decay rate of the exponential decay regression.

In some embodiments, after determining the average fidelity value of the quantum gate, the data processing circuit can further update the parameter of the quantum gate based on the average fidelity value of the quantum gate.

In some embodiments, a non-transitory computer-readable storage medium including instructions is also provided, and the instructions can be executed by a device (such as the disclosed encoder and decoder), for performing the above-described methods. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The device can include one or more processors (CPUs), an input/output interface, a network interface, and/or a memory.

The embodiments can further be described using the following clauses:

1. A non-transitory computer-readable medium storing a set of instructions that is executable by at least one processor of an apparatus to cause the apparatus to perform a method, the method comprising:
   based on a parameter of a quantum gate, generating representations of $m_1$ random unitary quantum gates, $m_1$ being an integer;
   determining a representation of a first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator;
   determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator;

sending, to a quantum computing device, hardware instructions corresponding to the representation of the first quantum-gate sequence and hardware instructions corresponding to the representation of the second quantum-gate sequence;

receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and determining a fidelity value of the quantum gate based on a first probability that a quantum state of the qubit is unchanged over the first number of measurements of the qubit and a second probability that the quantum state of the qubit is unchanged over the second number of measurements of the qubit.

2. The non-transitory computer-readable medium of clause 1, wherein the set of instructions that is executable by the at least one processor of the apparatus causes the apparatus to further perform:
updating the parameter of the quantum gate based on the fidelity value of the quantum gate.

3. The non-transitory computer-readable medium of clause 1, wherein the set of instructions that is executable by the at least one processor of the apparatus causes the apparatus to further perform:
based on the parameter of the quantum gate, generating representations of $m_2$ random unitary quantum gates, $m_2$ being an integer different from $m_1$;
determining a representation of a third quantum-gate sequence by inserting the quantum gate between each neighboring unitary quantum gates of the $m_2$ random unitary quantum gates and appending the quantum gate and a third recovery quantum gate to the $m_1$ random unitary quantum gates such that the third quantum-gate sequence is equivalent to the identity operator;
determining a representation of a fourth quantum-gate sequence by concatenating the $m_2$ random unitary quantum gates and appending a fourth recovery quantum gate to the $m_2$ random unitary quantum gates such that the fourth quantum-gate sequence is equivalent to the identity operator;
sending, to the quantum computing device, hardware instructions corresponding to the representation of the third quantum-gate sequence and hardware instructions corresponding to the representation of the fourth quantum-gate sequence;
receiving, from the quantum computing device, a third number of measurements of the qubit after applying the third quantum-gate sequence to the qubit for the third number of times by the quantum computing device and a fourth number of measurements of the qubit after applying the fourth quantum-gate sequence to the qubit for the fourth number of times by the quantum computing device;
determining a third probability that the quantum state of the qubit is unchanged over the third number of measurements of the qubit and a fourth probability that the quantum state of the qubit is unchanged over the fourth number of measurements of the qubit; and
determining an average fidelity value of the quantum gate based on the first probability, the second probability, the third probability, and the fourth probability.

4. The non-transitory computer-readable medium of clause 3, wherein determining the average fidelity value of the quantum gate based on the first probability, the second probability, the third probability, and the fourth probability comprises:
determining a first average probability as an average of the first probability and the third probability, and a second average probability as an average of the second probability and the fourth probability; and
determining the average fidelity value as a ratio of the first average probability over the second average probability.

5. The non-transitory computer-readable medium of clause 3, wherein determining the average fidelity value of the quantum gate based on the first probability, the second probability, the third probability, and the fourth probability comprises:
determining a first fidelity value by performing a first exponential decay regression using $m_1$ and $m_2$ as independent variables, and the first probability and the third probability as response variables;
determining a second fidelity value by performing a second exponential decay regression using $m_1$ and $m_2$ as independent variables, and using the second probability and the fourth probability as response variables; and
determining the average fidelity value as a ratio of the first fidelity value over the second fidelity value.

6. The non-transitory computer-readable medium of clause 3, wherein the set of instructions that is executable by the at least one processor of the apparatus causes the apparatus to further perform:
updating the parameter of the quantum gate based on the average fidelity value of the quantum gate.

7. The non-transitory computer-readable medium of any of clauses 1-6, wherein the representations of $m_1$ random unitary quantum gates comprise matrices.

8. The non-transitory computer-readable medium of any of clauses 1-7, wherein generating the representations of $m_1$ random unitary quantum gates comprises:
generating the representations of $m_1$ random unitary quantum gates in accordance with a Haar measure.

9. The non-transitory computer-readable medium of any of clauses 1-7, wherein generating the representations of $m_1$ random unitary quantum gates comprises:
generating the representations of $m_1$ random unitary quantum gates by pseudo-random sampling a space of unitary operators in accordance with a uniform probability distribution.

10. The non-transitory computer-readable medium of any of clauses 1-9, wherein the qubit comprises a superconducting qubit.

11. The non-transitory computer-readable medium of clause 10, wherein the quantum gate comprises an electromagnetic signal, and the parameter of the quantum gate comprises at least one of a length, an amplitude, or a shape of the electromagnetic signal.

12. The non-transitory computer-readable medium of any of clauses 1-11, wherein determining the fidelity value of the quantum gate comprises:
determining the fidelity value of the quantum gate as a ratio of the first probability over the second probability.

13. The non-transitory computer-readable medium of any of clauses 1-12, wherein the quantum computing device comprises a quantum circuit and a quantum controller configured to operate the quantum circuit, and wherein the quantum circuit comprises the qubit.

14. An apparatus, comprising:
a memory configured to store a set of instructions; and one or more processors communicatively coupled to the memory and configured to execute the set of instructions to cause the apparatus to perform:
based on a parameter of a quantum gate, generating representations of $m_1$ random unitary quantum gates, $m_1$ being an integer;
determining a representation of a first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator;
determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator;
sending, to a quantum computing device, hardware instructions corresponding to the representation of the first quantum-gate sequence and hardware instructions corresponding to the representation of the second quantum-gate sequence;
receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and
determining a fidelity value of the quantum gate based on a first probability that a quantum state of the qubit is unchanged over the first number of measurements of the qubit and a second probability that the quantum state of the qubit is unchanged over the second number of measurements of the qubit.

15. The apparatus of clause 14, wherein the one or more processors are further configured to execute the set of instructions to cause the apparatus to perform:
updating the parameter of the quantum gate based on the fidelity value of the quantum gate.

16. The apparatus of clause 14, wherein the one or more processors are further configured to execute the set of instructions to cause the apparatus to perform:
based on the parameter of the quantum gate, generating representations of $m_2$ random unitary quantum gates, $m_2$ being an integer different from $m_1$;
determining a representation of a third quantum-gate sequence by inserting the quantum gate after each neighboring unitary quantum gates of the $m_2$ random unitary quantum gates and appending a third recovery quantum gate to the $m_2$ random unitary quantum gates such that the third quantum-gate sequence is equivalent to the identity operator;
determining a representation of a fourth quantum-gate sequence by concatenating the $m_2$ random unitary quantum gates and appending a fourth recovery quantum gate to the $m_2$ random unitary quantum gates such that the fourth quantum-gate sequence is equivalent to the identity operator;
sending, to the quantum computing device, hardware instructions corresponding to the representation of the third quantum-gate sequence and hardware instructions corresponding to the representation of the fourth quantum-gate sequence;
receiving, from the quantum computing device, the third number of measurements of the qubit after applying the third quantum-gate sequence to the qubit for the third number of times by the quantum computing device and the fourth number of measurements of the qubit after applying the fourth quantum-gate sequence to the qubit for the fourth number of times by the quantum computing device;
determining a third probability that the quantum state of the qubit is unchanged over the third number of measurements of the qubit and a fourth probability that the quantum state of the qubit is unchanged over the fourth number of measurements of the qubit; and
determining an average fidelity value of the quantum gate based on the first probability, the second probability, the third probability, and the fourth probability.

17. The apparatus of clause 16, wherein determining the average fidelity value of the quantum gate based on the first probability, the second probability, the third probability, and the fourth probability comprises:
determining a first average probability as an average of the first probability and the third probability, and a second average probability as an average of the second probability and the fourth probability; and
determining the average fidelity value as a ratio of the first average probability and the second average probability.

18. The apparatus of clause 16, wherein determining the average fidelity value of the quantum gate based on the first probability, the second probability, the third probability, and the fourth probability comprises:
determining a first fidelity value by performing a first exponential decay regression using $m_1$ and $m_2$ as independent variables, and the first probability and the third probability as response variables;
determining a second fidelity value by performing a second exponential decay regression using $m_1$ and $m_2$ as independent variables, and using the second probability and the fourth probability as response variables; and
determining the average fidelity value as a ratio of the first fidelity value over the second fidelity value.

19. The apparatus of clause 16, wherein the one or more processors are further configured to execute the set of instructions to cause the apparatus to perform:
updating the parameter of the quantum gate based on the average fidelity value of the quantum gate.

20. The apparatus of any of clauses 14-19, wherein the representations of $m_1$ random unitary quantum gates comprise matrices.

21. The apparatus of any of clauses 14-20, wherein generating the representations of $m_1$ random unitary quantum gates comprises:
generating the representations of $m_1$ random unitary quantum gates in accordance with a Haar measure.

22. The apparatus of any of clauses 14-20, wherein generating the representations of $m_1$ random unitary quantum gates comprises:
generating the representations of $m_1$ random unitary quantum gates by pseudo-random sampling a space of unitary operators in accordance with a uniform probability distribution.

23. The apparatus of any of clauses 14-22, wherein the qubit comprises a superconducting qubit.

24. The apparatus of clause 23, wherein the quantum gate comprises an electromagnetic signal, and the parameter of the quantum gate comprises at least one of a length, an amplitude, or a shape of the electromagnetic signal.

25. The apparatus of any of clauses 14-24, wherein determining the fidelity value of the quantum gate comprises:
determining the fidelity value of the quantum gate as a ratio of the first probability over the second probability.

26. The apparatus of any of clauses 14-25, wherein the quantum computing device comprises a quantum circuit and a quantum controller configured to operate the quantum circuit, and wherein the quantum circuit comprises the qubit.

27. A computer-implemented method, comprising:
based on a parameter of a quantum gate, generating representations of $m_1$ random unitary quantum gates, $m_1$ being an integer;
determining a representation of a first quantum-gate sequence by inserting the quantum gate after each neighboring unitary quantum gates of the $m_1$ random unitary quantum gates and appending a first recovery quantum gate to the $m_1$ random unitary quantum gates such that the first quantum-gate sequence is equivalent to an identity operator;
determining a representation of a second quantum-gate sequence by concatenating the $m_1$ random unitary quantum gates and appending a second recovery quantum gate to the $m_1$ random unitary quantum gates such that the second quantum-gate sequence is equivalent to the identity operator;
sending, to a quantum computing device, hardware instructions corresponding to the representation of the first quantum-gate sequence and hardware instructions corresponding to the representation of the second quantum-gate sequence;
receiving, from the quantum computing device, a first number of measurements of a qubit after applying the first quantum-gate sequence to the qubit for the first number of times by the quantum computing device and a second number of measurements of the qubit after applying the second quantum-gate sequence to the qubit for the second number of times by the quantum computing device; and
determining a fidelity value of the quantum gate based on a first probability that a quantum state of the qubit is unchanged over the first number of measurements of the qubit and a second probability that the quantum state of the qubit is unchanged over the second number of measurements of the qubit.

28. The computer-implemented method of clause 27, further comprising:
updating the parameter of the quantum gate based on the fidelity value of the quantum gate.

29. The computer-implemented method of clause 27, further comprising:
based on the parameter of the quantum gate, generating representations of $m_2$ random unitary quantum gates, $m_2$ being an integer different from $m_1$;
determining a representation of a third quantum-gate sequence by inserting the quantum gate after each neighboring unitary quantum gates of the $m_2$ random unitary quantum gates and appending a third recovery quantum gate to the $m_2$ random unitary quantum gates such that the third quantum-gate sequence is equivalent to the identity operator;
determining a representation of a fourth quantum-gate sequence by concatenating the $m_2$ random unitary quantum gates and appending a fourth recovery quantum gate to the $m_2$ random unitary quantum gates such that the fourth quantum-gate sequence is equivalent to the identity operator;
sending, to the quantum computing device, hardware instructions corresponding to the representation of the third quantum-gate sequence and hardware instructions corresponding to the representation of the fourth quantum-gate sequence;
receiving, from the quantum computing device, the third number of measurements of the qubit after applying the third quantum-gate sequence to the qubit for the third number of times by the quantum computing device and the fourth number of measurements of the qubit after applying the fourth quantum-gate sequence to the qubit for the fourth number of times by the quantum computing device;
determining a third probability that the quantum state of the qubit is unchanged over the third number of measurements of the qubit and a fourth probability that the quantum state of the qubit is unchanged over the fourth number of measurements of the qubit; and
determining an average fidelity value of the quantum gate based on the first probability, the second probability, the third probability, and the fourth probability.

30. The computer-implemented method of clause 29, wherein determining the average fidelity value of the quantum gate based on the first probability, the second probability, the third probability, and the fourth probability comprises:
determining a first average probability as an average of the first probability and the third probability, and a second average probability as an average of the second probability and the fourth probability; and
determining the average fidelity value as a ratio of the first average probability over and the second average probability.

31. The computer-implemented method of clause 29, wherein determining the average fidelity value of the quantum gate based on the first probability, the second probability, the third probability, and the fourth probability comprises:
determining a first fidelity value by performing a first exponential decay regression using $m_1$ and $m_2$ as independent variables, and the first probability and the third probability as response variables;
determining a second fidelity value by performing a second exponential decay regression using $m_1$ and $m_2$ as independent variables, and using the second probability and the fourth probability as response variables; and
determining the average fidelity value as a ratio of the first fidelity value over the second fidelity value.

32. The computer-implemented method of clause 29, further comprising:
updating the parameter of the quantum gate based on the average fidelity value of the quantum gate.

33. The computer-implemented method of any of clauses 27-32, wherein the representations of $m_1$ random unitary quantum gates comprise matrices.

34. The computer-implemented method of any of clauses 27-33, wherein generating the representations of $m_1$ random unitary quantum gates comprises:
generating the representations of $m_1$ random unitary quantum gates in accordance with a Haar measure.

35. The computer-implemented method of any of clauses 27-33, wherein generating the representations of $m_1$ random unitary quantum gates comprises:
generating the representations of $m_1$ random unitary quantum gates by pseudo-random sampling a space of unitary operators in accordance with a uniform probability distribution.

36. The computer-implemented method of any of clauses 27-35, wherein the qubit comprises a superconducting qubit.

37. The computer-implemented method of clause 36, wherein the quantum gate comprises an electromagnetic signal, and the parameter of the quantum gate comprises at least one of a length, an amplitude, or a shape of the electromagnetic signal.

38. The computer-implemented method of any of clauses 27-37, wherein determining the fidelity value of the quantum gate comprises:
determining the fidelity value of the quantum gate as a ratio of the first probability over the second probability.

39. The computer-implemented method of any of clauses 27-38, wherein the quantum computing device comprises a quantum circuit and a quantum controller configured to operate the quantum circuit, and wherein the quantum circuit comprises the qubit.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. As used herein, the indefinite articles "a" and "an" mean "one or more." Similarly, the use of a plural term does not necessarily denote a plurality unless it is unambiguous in the given context.

As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

It is appreciated that the above described embodiments can be implemented by hardware, or software (program codes), or a combination of hardware and software. If implemented by software, it can be stored in the above-described computer-readable media. The software, when executed by the processor can perform the disclosed methods. The computing units and other functional units described in the present disclosure can be implemented by hardware, or software, or a combination of hardware and software. One of ordinary skill in the art will also understand that multiple ones of the above described modules/units can be combined as one module/unit, and each of the above described modules/units can be further divided into a plurality of sub-modules/sub-units.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as example only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A non-transitory computer-readable medium storing a set of instructions that is executable by at least one processor of an apparatus to cause the apparatus to perform a method, the method comprising:
sending, to a quantum computing device, hardware instructions corresponding to a representation of a first quantum-gate sequence and hardware instructions corresponding to a representation of a second quantum-gate sequence different from the first quantum-gate sequence, the first quantum-gate sequence and the second quantum-gate sequence being generated based on a quantum gate;
receiving, from the quantum computing device, a first number of measurements of a qubit after applying the first quantum-gate sequence to the qubit for a first number of times by the quantum computing device and a second number of measurements of the qubit after applying the second quantum-gate sequence to the qubit for a second number of times by the quantum computing device; and
determining a fidelity value of the quantum gate based on the first number of measurements and the second number of measurements.

2. The non-transitory computer-readable medium of claim 1, wherein the quantum computing device comprises a quantum circuit and a quantum controller configured to operate the quantum circuit, and wherein the quantum circuit comprises the qubit.

3. The non-transitory computer-readable medium of claim 1, wherein the set of instructions that is executable by the at least one processor of the apparatus causes the apparatus to further perform:
based on a parameter of the quantum gate, generating representations of $m_1$ random unitary quantum gates, $m_1$ being an integer;
determining the representation of the first quantum-gate sequence by inserting the quantum gate between each neighboring unitary quantum gates of the $m_1$ random unitary quantum gates and appending the quantum gate and a first recovery quantum gate to the $m_1$ random unitary quantum gates such that the first quantum-gate sequence is equivalent to an identity operator; and
determining the representation of the second quantum-gate sequence by concatenating the $m_1$ random unitary quantum gates and appending a second recovery quantum gate to the $m_1$ random unitary quantum gates such that the second quantum-gate sequence is equivalent to the identity operator.

4. The non-transitory computer-readable medium of claim 3, wherein the representations of $m_1$ random unitary quantum gates comprise matrices.

5. The non-transitory computer-readable medium of claim 3, wherein generating the representations of $m_1$ random unitary quantum gates comprises:
   generating the representations of $m_1$ random unitary quantum gates in accordance with a Haar measure.

6. The non-transitory computer-readable medium of claim 3, wherein generating the representations of $m_1$ random unitary quantum gates comprises:
   generating the representations of $m_1$ random unitary quantum gates by pseudo-random sampling a space of unitary operators in accordance with a uniform probability distribution.

7. The non-transitory computer-readable medium of claim 3, wherein the set of instructions that is executable by the at least one processor of the apparatus causes the apparatus to further perform:
   updating the parameter of the quantum gate based on the fidelity value of the quantum gate.

8. The non-transitory computer-readable medium of claim 1, wherein determining the fidelity value of the quantum gate based on the first number of measurements and the second number of measurements comprises:
   determining the fidelity value of the quantum gate based on a first probability that a quantum state of the qubit is unchanged over the first number of measurements of the qubit and a second probability that the quantum state of the qubit is unchanged over the second number of measurements of the qubit.

9. The non-transitory computer-readable medium of claim 1, wherein the set of instructions that is executable by the at least one processor of the apparatus causes the apparatus to further perform:
   sending, to the quantum computing device, hardware instructions corresponding to a representation of a third quantum-gate sequence and hardware instructions corresponding to a representation of a fourth quantum-gate sequence different from the third quantum-gate sequence;
   receiving, from the quantum computing device, a third number of measurements of the qubit after applying the third quantum-gate sequence to the qubit for a third number of times by the quantum computing device and a fourth number of measurements of the qubit after applying the fourth quantum-gate sequence to the qubit for a fourth number of times by the quantum computing device; and
   determining an average fidelity value of the quantum gate based on the first number of measurements, the second number of measurements, the third number of measurements, and the fourth number of measurements.

10. The non-transitory computer-readable medium of claim 9, wherein the set of instructions that is executable by the at least one processor of the apparatus causes the apparatus to further perform:
    based on a parameter of the quantum gate, generating representations of $m_2$ random unitary quantum gates, $m_2$ being an integer different from $m_1$;
    determining the representation of the third quantum-gate sequence by inserting the quantum gate between each neighboring unitary quantum gates of the $m_2$ random unitary quantum gates and appending the quantum gate and a third recovery quantum gate to the $m_2$ random unitary quantum gates such that the third quantum-gate sequence is equivalent to an identity operator; and
    determining the representation of the fourth quantum-gate sequence by concatenating the $m_2$ random unitary quantum gates and appending a fourth recovery quantum gate to the $m_2$ random unitary quantum gates such that the fourth quantum-gate sequence is equivalent to the identity operator.

11. The non-transitory computer-readable medium of claim 10, wherein the set of instructions that is executable by the at least one processor of the apparatus causes the apparatus to further perform:
    updating the parameter of the quantum gate based on the average fidelity value of the quantum gate.

12. The non-transitory computer-readable medium of claim 10, wherein the quantum gate comprises an electromagnetic signal, and the parameter of the quantum gate comprises at least one of a length, an amplitude, or a shape of the electromagnetic signal.

13. The non-transitory computer-readable medium of claim 9, wherein determining the average fidelity value of the quantum gate based on the first number of measurements, the second number of measurements, the third number of measurements, and the fourth number of measurements comprises:
    determining the fidelity value of the quantum gate based on a first probability that a quantum state of the qubit is unchanged over the first number of measurements of the qubit and a second probability that the quantum state of the qubit is unchanged over the second number of measurements of the qubit;
    determining a third probability that the quantum state of the qubit is unchanged over the third number of measurements of the qubit and a fourth probability that the quantum state of the qubit is unchanged over the fourth number of measurements of the qubit; and
    determining the average fidelity value of the quantum gate based on the first probability, the second probability, the third probability, and the fourth probability.

14. The non-transitory computer-readable medium of claim 13, wherein determining the average fidelity value of the quantum gate based on the first probability, the second probability, the third probability, and the fourth probability comprises:
    determining a first average probability as an average of the first probability and the third probability, and a second average probability as an average of the second probability and the fourth probability; and
    determining the average fidelity value as a ratio of the first average probability over the second average probability.

15. The non-transitory computer-readable medium of claim 13, wherein determining the average fidelity value of the quantum gate based on the first probability, the second probability, the third probability, and the fourth probability comprises:
    determining a first fidelity value by performing a first exponential decay regression using $m_1$ and $m_2$ as independent variables, and the first probability and the third probability as response variables;
    determining a second fidelity value by performing a second exponential decay regression using $m_1$ and $m_2$ as independent variables, and using the second probability and the fourth probability as response variables; and
    determining the average fidelity value as a ratio of the first fidelity value over the second fidelity value.

16. The non-transitory computer-readable medium of claim 13, wherein determining the fidelity value of the quantum gate comprises:
determining the fidelity value of the quantum gate as a ratio of the first probability over the second probability.

17. The non-transitory computer-readable medium of claim 1, wherein the qubit comprises a superconducting qubit.

18. An apparatus, comprising:
a memory configured to store a set of instructions; and
one or more processors communicatively coupled to the memory and configured to execute the set of instructions to cause the apparatus to perform:
sending, to a quantum computing device, hardware instructions corresponding to a representation of a first quantum-gate sequence and hardware instructions corresponding to a representation of a second quantum-gate sequence different from the first quantum-gate sequence, the first quantum-gate sequence and the second quantum-gate sequence being generated based on a quantum gate;
receiving, from the quantum computing device, a first number of measurements of a qubit after applying the first quantum-gate sequence to the qubit for a first number of times by the quantum computing device and a second number of measurements of the qubit after applying the second quantum-gate sequence to the qubit for a second number of times by the quantum computing device; and
determining a fidelity value of the quantum gate based on the first number of measurements and the second number of measurements.

19. The apparatus of claim 18, wherein the quantum computing device comprises a quantum circuit and a quantum controller configured to operate the quantum circuit, and wherein the quantum circuit comprises the qubit.

20. A computer-implemented method, comprising:
sending, to a quantum computing device, hardware instructions corresponding to a representation of a first quantum-gate sequence and hardware instructions corresponding to a representation of a second quantum-gate sequence different from the first quantum-gate sequence, the first quantum-gate sequence and the second quantum-gate sequence being generated based on a quantum gate;
receiving, from the quantum computing device, a first number of measurements of a qubit after applying the first quantum-gate sequence to the qubit for a first number of times by the quantum computing device and a second number of measurements of the qubit after applying the second quantum-gate sequence to the qubit for a second number of times by the quantum computing device; and
determining a fidelity value of the quantum gate based on the first number of measurements and the second number of measurements.

* * * * *